(12) United States Patent
Chen

(10) Patent No.: US 8,686,430 B2
(45) Date of Patent: Apr. 1, 2014

(54) BUFFER LAYER FOR GAN-ON-SI LED

(75) Inventor: Zhen Chen, Pleasanton, CA (US)

(73) Assignee: Toshiba Techno Center Inc., Tokyo (JP)

( * ) Notice: Subject to any disclaimer, the term of this patent is extended or adjusted under 35 U.S.C. 154(b) by 210 days.

(21) Appl. No.: 13/227,406

(22) Filed: Sep. 7, 2011

(65) Prior Publication Data

US 2013/0056745 A1    Mar. 7, 2013

(51) Int. Cl.
*H01L 33/42* (2010.01)
*H01L 33/48* (2010.01)

(52) U.S. Cl.
USPC ............. 257/76; 257/E33.025; 257/E33.056

(58) Field of Classification Search
USPC ..................... 257/76, E33.025, E33.056
See application file for complete search history.

(56) References Cited

U.S. PATENT DOCUMENTS

| | | | |
|---|---|---|---|
| 5,306,662 A | 4/1994 | Nakamura et al. | |
| 5,371,409 A | 12/1994 | McCaldin et al. | 257/741 |
| 5,408,120 A | 4/1995 | Manabe et al. | |
| 5,432,808 A | 7/1995 | Hatano et al. | 372/45.01 |
| 5,468,678 A | 11/1995 | Nakamura et al. | |
| 5,563,422 A * | 10/1996 | Nakamura et al. | 257/13 |
| 5,578,839 A | 11/1996 | Nakamura et al. | |
| 5,734,182 A | 3/1998 | Nakamura et al. | |
| 5,747,832 A | 5/1998 | Nakamura et al. | |
| 5,753,939 A | 5/1998 | Sassa et al. | |
| 5,766,783 A | 6/1998 | Utsumi et al. | 428/698 |
| 5,777,350 A | 7/1998 | Nakamura et al. | |
| 5,959,307 A | 9/1999 | Nakamura et al. | |
| 5,959,401 A | 9/1999 | Asami et al. | |
| 6,005,258 A | 12/1999 | Manabe et al. | |
| 6,040,588 A | 3/2000 | Koide et al. | |
| RE36,747 E | 6/2000 | Manabe et al. | |
| 6,121,635 A | 9/2000 | Watanabe et al. | 257/91 |
| 6,215,133 B1 | 4/2001 | Nakamura et al. | |
| 6,242,764 B1 | 6/2001 | Ohba et al. | 257/190 |

(Continued)

FOREIGN PATENT DOCUMENTS

| | | |
|---|---|---|
| JP | 4267376 A | 2/1991 |
| JP | 2626431 | 5/1994 |

(Continued)

OTHER PUBLICATIONS

International Search Report and Written Opinion by the Korean Intellectual Property Office (KIPO) as international searching authority (ISA) in the related international application PCT/US2012/052821 dated Jan. 30, 2013 (10 pages).

(Continued)

*Primary Examiner* — Matthew W Such
*Assistant Examiner* — Monica D Harrison
(74) *Attorney, Agent, or Firm* — Hogan Lovells US LLP

(57) ABSTRACT

A buffer layer of zinc telluride (ZnTe) or titanium dioxide (TiO$_2$) is formed directly on a silicon substrate. Optionally, a layer of AlN is then formed as a second layer of the buffer layer. A template layer of GaN is then formed over the buffer layer. An epitaxial LED structure for a GaN-based blue LED is formed over the template layer, thereby forming a first multilayer structure. A conductive carrier is then bonded to the first multilayer structure. The silicon substrate and the buffer layer are then removed, thereby forming a second multilayer structure. Electrodes are formed on the second multilayer structure, and the structure is singulated to form blue LED devices.

13 Claims, 19 Drawing Sheets

SIMPLIFIED CROSS-SECTIONAL SIDE VIEW OF THE WHITE LED ASSEMBLY WITH ONE LED DEVICE (NOT TO SCALE)

(56) References Cited

U.S. PATENT DOCUMENTS

| | | | |
|---|---|---|---|
| 6,265,726 B1 | 7/2001 | Manabe et al. | |
| 6,326,236 B1 | 12/2001 | Koide et al. | |
| 6,420,733 B2 | 7/2002 | Koide et al. | |
| 6,541,293 B2 | 4/2003 | Koide et al. | |
| 6,610,995 B2 | 8/2003 | Nakamura et al. | |
| 6,617,060 B2 | 9/2003 | Weeks, Jr. et al. | 428/698 |
| 6,657,236 B1 | 12/2003 | Thibeault et al. | |
| 6,800,500 B2 | 10/2004 | Coman et al. | |
| 6,825,498 B2 | 11/2004 | Lai et al. | 257/94 |
| 6,838,693 B2 | 1/2005 | Kozaki | |
| 6,849,881 B1 | 2/2005 | Harle et al. | |
| 6,891,197 B2 | 5/2005 | Bhat et al. | |
| 6,906,352 B2 | 6/2005 | Edmond et al. | |
| 6,916,676 B2 | 7/2005 | Sano et al. | |
| 6,933,519 B2 * | 8/2005 | Kishino et al. | 257/22 |
| 6,951,695 B2 | 10/2005 | Xu et al. | |
| 6,967,355 B2 | 11/2005 | Kryliouk et al. | 257/103 |
| 6,977,395 B2 | 12/2005 | Yamada et al. | |
| 7,026,653 B2 | 4/2006 | Sun | |
| 7,106,090 B2 | 9/2006 | Harle et al. | |
| 7,115,908 B2 | 10/2006 | Watanabe et al. | |
| 7,138,286 B2 | 11/2006 | Manabe et al. | |
| 7,193,246 B1 | 3/2007 | Tanizawa et al. | |
| 7,247,985 B2 | 7/2007 | Kaneko et al. | 313/506 |
| 7,262,436 B2 | 8/2007 | Kondoh et al. | |
| 7,312,474 B2 | 12/2007 | Emerson et al. | |
| 7,335,920 B2 | 2/2008 | Denbaars et al. | |
| 7,345,297 B2 | 3/2008 | Yamazoe et al. | |
| 7,348,602 B2 | 3/2008 | Tanizawa | |
| 7,402,838 B2 | 7/2008 | Tanizawa et al. | |
| 7,442,966 B2 | 10/2008 | Bader et al. | |
| 7,446,345 B2 | 11/2008 | Emerson et al. | |
| 7,491,565 B2 | 2/2009 | Coman et al. | |
| 7,547,908 B2 | 6/2009 | Grillot et al. | |
| 7,547,925 B2 | 6/2009 | Wong et al. | 257/103 |
| 7,560,749 B2 | 7/2009 | Sakata et al. | 257/102 |
| 7,611,917 B2 | 11/2009 | Emerson et al. | |
| 7,691,651 B2 | 4/2010 | Park | 438/22 |
| 7,709,851 B2 | 5/2010 | Bader et al. | |
| 7,737,459 B2 | 6/2010 | Edmond et al. | |
| 7,754,514 B2 | 7/2010 | Yajima et al. | |
| 7,768,016 B2 * | 8/2010 | Kreupl | 257/76 |
| 7,791,061 B2 | 9/2010 | Edmond et al. | |
| 7,791,101 B2 | 9/2010 | Bergmann et al. | |
| 7,795,623 B2 | 9/2010 | Emerson et al. | |
| 7,813,400 B2 | 10/2010 | Denbaars et al. | 372/45.011 |
| 7,910,945 B2 | 3/2011 | Donofrio et al. | |
| 7,939,844 B2 | 5/2011 | Hahn et al. | |
| 7,947,994 B2 | 5/2011 | Tanizawa et al. | |
| 7,956,360 B2 * | 6/2011 | Haskell et al. | 257/64 |
| 7,968,865 B2 | 6/2011 | LaRoche et al. | 257/11 |
| 8,021,904 B2 | 9/2011 | Chitnis | |
| 8,030,665 B2 | 10/2011 | Nagahama et al. | |
| 2003/0178642 A1 | 9/2003 | Tanaka et al. | 257/200 |
| 2004/0201030 A1 | 10/2004 | Kryliouk et al. | 257/103 |
| 2007/0210304 A1 | 9/2007 | Komiyama et al. | 257/40 |
| 2008/0135859 A1 | 6/2008 | Cho et al. | 257/94 |
| 2010/0140735 A1 | 6/2010 | Bommena et al. | 257/506 |
| 2010/0282309 A1 * | 11/2010 | Pschirer et al. | 136/255 |

FOREIGN PATENT DOCUMENTS

| | | |
|---|---|---|
| JP | 2681733 | 5/1994 |
| JP | 2917742 | 6/1994 |
| JP | 2827794 | 8/1994 |
| JP | 2778405 | 9/1994 |
| JP | 2803741 | 9/1994 |
| JP | 2785254 | 1/1995 |
| JP | 8264894 A | 3/1995 |
| JP | 2735057 | 3/1996 |
| JP | 2956489 | 3/1996 |
| JP | 2666237 | 12/1996 |
| JP | 2890396 | 12/1996 |
| JP | 3250438 | 12/1996 |
| JP | 3135041 | 6/1997 |
| JP | 11-260835 | 7/1997 |
| JP | 11040847 A | 7/1997 |
| JP | 3209096 | 12/1997 |
| JP | 3506874 | 1/1998 |
| JP | 3654738 | 2/1998 |
| JP | 3795624 | 2/1998 |
| JP | 3304787 | 5/1998 |
| JP | 3344257 | 8/1998 |
| JP | 3223832 | 9/1998 |
| JP | 3374737 | 12/1998 |
| JP | 3314666 | 3/1999 |
| JP | 3748011 B2 | 6/1999 |
| JP | 4118370 | 7/1999 |
| JP | 4118371 | 7/1999 |
| JP | 3548442 | 8/1999 |
| JP | 3622562 | 11/1999 |
| JP | 3424629 | 8/2000 |
| JP | 4860024 | 8/2000 |
| JP | 3063756 | 9/2000 |
| JP | 4629178 | 9/2000 |
| JP | 3063757 | 10/2000 |
| JP | 3511970 | 10/2000 |
| JP | 3551101 | 5/2001 |
| JP | 2004-006562 | 6/2001 |
| JP | 3427265 | 6/2001 |
| JP | 3646649 | 10/2001 |
| JP | 3780887 | 5/2002 |
| JP | 3890930 | 5/2002 |
| JP | 3786114 | 4/2004 |
| JP | 4904261 | 6/2004 |

OTHER PUBLICATIONS

Armitage et al., "Lattice-matched HfN buffer layers for epitaxy of GaN on Si," Applied Physics Letters, vol. 81, No. 8, May 2002, pp. 1450-1452 (3 pages).

Lee et al., "Surface Morphologies and Optical Properties in $Cd_xZn_{1-x}Te/ZnTe$ Quantum Dots on GaAs(100) and Si(100) Substrates," Journal of the Korean Physical Society, vol. 50, No. 3, Mar. 2007, pp. 759-762 (4 pages).

Takashi Matsuoka, "Progress in MOVPE-Growth of GaN to InN," Quantum Sensing and Nanophotonic Devices (SPIE), vol. 6900, 69000S (2008) (6 pages).

Wendy Sarney, "Understanding Transmission Electron Microscopy Diffraction Patterns Obtained From Infrared Semiconductor Materials," Army Research Laboratory, Adelphi, MD; ARL-TR-3128 Dec. 2003 (23 pages).

Mike Cooke, "High-Brightness Nitride LEDs on Silicon Through Wafer Bonding", Jun. 4, 2011. (URL: "http://www.semiconductor-today.com/news_items/2011/JUNE/KOREAPHOTONICS_040611.html") (2 pages).

Dadgar et al., "Epitaxy of GaN on silicon-impact of symmetry and surface reconstruction," New Journal of Physics, vol. 9, No. 389 (2007); IOP Publishing Ltd., http://iopscience.iop.org/1367-2630/9/10/389 (10 pages).

Bae et al., "Surface Investigation of a Cubic AlN Buffer Layer and GaN Grown on Si(111) and Si(100) as Revealed by Atomic Force Microscopy," Journal of the Korean Physical Society, vol. 49, No. 3, Sep. 2006, pp. 1092-1096 (5 pages).

Keyan et al., "Structural analysis of metalorganic chemical vapor deposited AlN nucleation layers on Si(111)," Singapore-MIT Alliance, Jan. 2004, citable URI: http://hdl.handle.net/1721.1/3841 (4 pages).

* cited by examiner

CROSS-SECTIONAL SIDE VIEW
OF WHITE LED ASSEMBLY

TOP-DOWN VIEW OF WHITE LED
ASSEMBLY

SIMPLIFIED CROSS-SECTIONAL SIDE VIEW OF THE
WHITE LED ASSEMBLY WITH ONE LED DEVICE
(NOT TO SCALE)

TOP-DOWN VIEW OF THE BLUE LED DEVICE

CROSS-SECTIONAL SIDE VIEW OF THE
COMPLETED LED DEVICE TAKEN ALONG LINE A-A

FORM LED PAN STRUCTURE ON SILICON SUBSTRATE

ADD CURRENT BLOCKING STRUCTURES

ADD REFLECTIVE LAYER (SILVER)

ADD SILVER, ENCAPSULATION AND NON-REACTIVE BARRIER METAL LAYERS

ADD BOND METAL

WAFER BOND THE CARRIER WAFER TO THE DEVICE WAFER

WAFER BONDING TEMPERATURE CYCLE

FLIP THE RESULTING WAFER BONDED ASSEMBLY

REMOVE SILICON SUBSTRATE, BUFFER AND TEMPLATE

WAFER BONDED STRUCTURE AFTER REMOVAL STEP
AND MESA ETCHING STEP

WAFER BONDED STRUCTURE OF FIG. 15
TAKEN ALONG LINE B-B

ROUGHEN SURFACE

ADD ELECTRODES

| NUMBER | NAME OF LAYER OR STRUCTURE | COMPOSITION AND STRUCTURE | THICKNESS |
|---|---|---|---|
| 1 | SUBSTRATE | SILICON | |
| 2 | BUFFER LAYER | ZnS 50nm (on top of substrate)<br>AlN 250nm (on top of ZnS)<br>AlGaN 250nm (on top of AlN) | 550nm |
| 3 | TEMPLATE LAYER | u-GaN<br>UNDOPED | 1000nm |
| 4 | LOW RESISTANCE LAYER (LRL) | n-GaN/AlGaN PERIODS<br>5 PERIODS (SUPERLATTICE)<br>n-GaN 100nm (UPPER SUBLAYER)<br>$Al_{0.3}Ga_{0.7}N$ (UNDOPED) 25nm (LOWER SUBLAYER)<br>EACH THINNER AlGaN SUBLAYER IS "STRAINED TO" A THICKER LAYER OF GaN<br>SHEET RESISTANCE IS LOWER THAN THE SHEET RESISTANCE OF THE N-TYPE LAYER<br>n-GaN DOPANT = 1E18 ATOMS/CCM SILICON | 625nm |
| 5 | N-TYPE LAYER | n-GaN/n-AlGaN:Si or AlN PERIODS<br>(TOTAL THICKNESS >2000nm)<br>5 PERIODS<br>n-GaN <1000 nm (e.g., 900nm)<br>n-AlGaN:Si <25nm (e.g., 5nm)<br>ONE n-GaN SUBLAYER IS AT THE TOP OF THE N-TYPE LAYER, AND ANOTHER IS AT THE BOTTOM OF THE N-TYPE LAYER<br>SHEET RESISTANCE OF THE N-TYPE LAYER AT THE LRL/N-TYPE LAYER INTERFACE IS >15 OHMS/SQUARE | ~5000nm |
| 6 | STRAIN RELEASE LAYER | n-GaN DOPANT = 5E18 ATOMS/CCM SILICON<br>$In_xGa_{1-x}N/In_yGaN_{1-y}$ PERIODS<br>30 PERIODS<br>$In_xGa_{1-x}N$ 1-30nm, $0<x<0.12$<br>$In_yGa_{1-y}N$ 1-30nm, $0<y<0.12$ | 120nm |

FIG. 19A

| 7 | ACTIVE LAYER | InGaN/GaN PERIODS<br><br>10 PERIODS (MQW)<br><br>InGaN   3nm<br>GaN   10nm<br>In = 15%<br><br>EMITS NON-MONOCHROMATIC 440nm-490nm WAVELENGTH LIGHT | 130nm |
|---|---|---|---|
| 8 | P-TYPE LAYER | p-GaN<br>DOPANT TYPE = MAGNESIUM<br>DOPANT CONCENTRATION = 1E20 ATOMS/CCM<br>UPPER SURFACE IS SUBSTANTALLY PLANAR - NO CURRENT FOCUSING RIDGE STRUCTURES | 300nm |
| 9 | CURRENT BLOCKING LAYER | SILICON DIOXIDE | 200nm |
| 10 | HIGHLY REFLECTIVE LAYER | SILVER | 200nm |
| 11 | SILVER ENCAPSULATION LAYER | PLATINUM<br>(<200nm PLATINUM IN THE ENTIRE LED DEVICE) | 100nm |
| 12 | NON-REACTIVE BARRIER METAL LAYER | TITANIUM<br>(NONREACTIVE BARRIER METAL >50nm THICK) | 200nm |
| 13 | BOND METAL LAYER | GOLD 500nm<br>GOLD 80%/SN 20% 3000nm (EUTECTIC)<br>GOLD 500nm | 4000nm |
| 14 | ADHESION AND BARRIER METAL LAYER | TITANIUM | 200nm |
| 15 | CONDUCTIVE CARRIER | CONDUCTIVE SILICON SUBSTRATE | 150,000nm |
| 16 | P-ELECTRODE METAL | Ni-Au (20/200 nm) | 220nm |
| 17 | N-ELECTRODE METAL | Ti-Al-Ni-Au (20/100/20/200 nm) | 340nm |
| 18 | BONDING LAYER | SILVER EPOXY | ~3000nm |
| 19 | PCB | METAL CORE PCB (ALUMINUM) | |
| 20 | RETAINING RING | SILICONE | |
| 21 | PHOSPHOR | | |

FIG. 19B

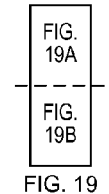

KEY TO FIG. 19

ZnTe OR TiO₂ BUFFER LAYER ON A SILICON SUBSTRATE
BETWEEN THE SUBSTRATE AND A GaN LED STRUCTURE

BUFFER LAYER FOR GAN-ON-SI LED

TECHNICAL FIELD

The present disclosure relates generally to GaN-based blue LEDs manufactured on silicon substrates and related methods and structures.

BACKGROUND INFORMATION

A Light Emitting Diode (LED) is a solid state device that converts electrical energy to light. Light is emitted from an active layer of semiconductor materials sandwiched between oppositely doped layers when a voltage is applied across the doped layers. There are many different LED device structures that are made of different materials and have different structures and that perform in different ways. Some emit laser light, and others generate non-monochromatic and non-coherent light. Some are optimized for performance in particular applications. Some are high power devices and others are not. Some emit light as infrared radiation, whereas others emit visible light of various colors, and still others emit ultraviolet light. Some are expensive to manufacture, whereas others are less expensive. For commercial general lighting applications, a blue LED structure is often used. Such a blue LED having a Multiple Quantum Well (MQW) active layer involving indium-gallium-nitride may, for example, emit non-monochromatic and non-coherent light having a wavelength in a range from 440 nanometers to 490 nanometers. A phosphor coating is then typically provided that absorbs some of the emitted blue light. The phosphor in turn fluoresces to emit light of other wavelengths so that the light the overall LED device emits has a wider range of wavelengths. The overall LED device that emits the wider range of wavelengths is often referred to as a "white" LED.

Although gallium-nitride substrate wafers are available, they are very expensive. The epitaxial layers of commercial blue LEDs are therefore typically grown on wafers of other types of substrates such as, for example, sapphire wafers. These other substrates are, however, still undesirably expensive. Common integrated circuits of the type employed in personal computers are generally fabricated on silicon substrates. As a result of the high volumes of silicon substrates produced for the computer industry, silicon substrates are relatively inexpensive as compared to sapphire substrates. Moreover, second hand semiconductor processing equipment for processing silicon substrate wafers is often available at low prices due to the fact that integrated circuit fabrication companies frequently upgrade their fabrication facilities in order to keep up with advances in integrated circuit manufacturing technology. It therefore would be desirable from a cost point of view to be able to fabricate GaN-based LEDs on relatively inexpensive silicon substrate wafers and to use the available second-hand semiconductor processing equipment for processing such silicon wafers, but there are many problems with growing high quality GaN epitaxial layers on silicon substrates.

Many of the problems associated with growing high quality GaN epitaxial layers on silicon substrates derive from the fact that the lattice constant of silicon is substantially different from the lattice constant of GaN. When GaN is grown epitaxially on a silicon substrate, the epitaxial material being grown may exhibit an undesirably high density of lattice defects. If the GaN layer is grown to be thick enough, then stress within the GaN layer may result in a type of cracking in the latter-grown portions of the GaN material. Moreover, silicon and GaN have different coefficients of thermal expansion. If the temperature of a structure involving GaN disposed on a silicon substrate is increased, for example, then the silicon material portion of the structure will expand at a different rate from the rate at which the GaN material expands. These different rates of thermal expansive give rise to stress between the various layers of the LED device. This stress may cause cracking and other problems. Furthermore, it is difficult to grow GaN on a silicon substrate because GaN is a compound material and Si is an elemental material. The transition from nonpolar to polar structure, combined with the substantial lattice mismatch, generates defects. For these and other reasons, the epitaxial LED structure portions of most commercially-available white LED devices are not grown on silicon substrates. Improved processes and structures for fabricating blue LEDs on silicon substrates are sought.

The manufacture of blue LEDs grown on silicon substrates also typically involves wafer bonding. In one prior art process, an epitaxial blue LED structure is grown on a non-GaN substrate to form a device wafer structure. A layer of silver is formed on the epitaxial LED structure to function as a mirror. A barrier metal layer involving multiple periods of platinum and titanium-tungsten is then disposed on the silver mirror. The platinum layer in each period is a thin 60 nm layer. The titanium/tungsten layer in each period is about 10 nm thick and involves about approximately ninety percent tungsten. Five or more such periods are provided. Once the device wafer structure has been formed in this way, a carrier wafer structure is wafer bonded to the device wafer structure. The original non-GaN substrate of the device wafer structure is then removed and the resulting wafer bonded structure is singulated to form LED devices. In this prior art process, a layer of bonding metal is used to wafer bond the carrier wafer structure to the device wafer structure. This bonding metal layer involves a gold/tin sublayer. When the gold/tin sublayer is melted during wafer bonding, tin from this gold/tin sublayer does not penetrate into the silver layer due to the thickness of the multi-period barrier metal layer and due to a short high temperature cycle being used to melt the bonding metal. This prior art process is recognized to work well.

SUMMARY

In a first novel aspect, a white LED assembly involves a blue LED device. The blue LED device is manufactured by epitaxially growing a Low Resistance Layer (LRL) over a silicon substrate. In one example, a buffer layer is grown directly on the silicon wafer substrate, and then a template layer of undoped gallium-nitride is grown directly on the buffer layer, and then the LRL is grown directly on the template layer.

In one example, the LRL is a superlattice structure involving multiple periods, where each period is thin (less than 300 nm thick) and involves a relatively thick gallium-nitride sublayer (for example, 100 nm thick) and a relatively thin undoped aluminum-gallium-nitride sublayer (for example, 25 nm thick). The bottom sublayer of the LRL is a sublayer of GaN. The top sublayer of the LRL is also a sublayer of GaN. There are four undoped aluminum-gallium-nitride sublayers in the LRL.

The blue LED device involves an indium-containing light-emitting active layer sandwiched between two oppositely doped layers. This structure of an active layer sandwiched between two oppositely doped layers is referred to here as a "PAN structure". The n-type layer of the PAN structure is grown directly on the upper surface of the LRL so that the n-type layer is disposed directly on a GaN sublayer of the LRL. The n-type layer may involve periods of gallium-nitride and aluminum-gallium-nitride as well, but the gallium-nitride sublayers of the n-type layer are substantially thicker than are the gallium-nitride sublayers of the LRL. In addition, the aluminum-gallium-nitride sublayers of the n-type layer are substantially thinner than are the aluminum-gallium-nitride sublayers of the LRL. The aluminum-gallium-nitride sublayers of the n-type layer are silicon doped to have a silicon concentration of more than $1 \times 10^{18}$ atoms/cm$^3$, whereas the aluminum-gallium-nitride sublayers of the LRL layer are undoped and have a silicon concentration of less than $1 \times 10^{18}$ atoms/cm$^3$.

In subsequent processing, the face side of the silicon device wafer structure is wafer bonded to a carrier wafer structure involving a conductive carrier. The conductive carrier may, for example, be a monocrystalline silicon wafer that is doped to be conductive. After this wafer bonding, the original silicon wafer substrate is removed by chemical mechanical polishing and/or by other suitable methods.

In a first specific example, the original silicon wafer substrate, the buffer layer and the template layer are removed but at least a portion of the LRL layer is left. After the removal step, the exposed surface of the LRL that remains is a sublayer of gallium-nitride. Electrodes are added, and the wafer bonded structure is singulated into individual blue LED devices. Within each blue LED device, the n-type layer of the PAN structure is in direct contact with at least a portion of the LRL layer. The LRL layer has a sheet resistance at the LRL/n-type layer interface that is lower than the sheet resistance of the n-type layer at the LRL/n-type layer interface. The sheet resistance of the n-type layer is more than fifteen ohms per square.

In such a blue LED device, the LRL has two functions. A first function is that in the process of growing the n-type gallium-nitride layer, the presence of the LRL reduces the concentration of lattice defects in the n-type layer that otherwise would be present. The LRL functions to block dislocation threads originating in the lower template layer from extending up and into the n-type layer. A second function is a current spreading function. The LRL is formed such that a so-called two-dimensional gas of high mobility electrons is present in the layers of the superlattice of the LRL. As a result of this two-dimensional electron gas, the sheet resistance of the LRL at the LRL/n-type layer interface is substantially lower than the sheet resistance of the n-type layer. The relatively low resistivity LRL facilitates lateral current spreading on one side of the n-type layer. Current flow through the LRL/n-type layer interface plane during LED operation is therefore more uniform than it otherwise would be were the LRL not present.

In a second specific example, the original silicon wafer substrate, the buffer layer, the template layer, and the LRL are all removed. The LRL is entirely removed. Electrodes are added, and the wafer bonded structure is singulated into individual LED devices. In each LED device, the n-type layer of the PAN structure is not in contact with any portion of the LRL because the LRL was completely removed. In this second specific example, the LRL serves the first function of reducing the concentration of lattice defects in the n-type layer.

In a second novel aspect, a wafer bonding process involves wafer bonding a carrier wafer structure to a device wafer structure by melting a layer of eutectic metal and thereby forming a wafer bonded structure. Prior to the melting, the device wafer structure involves an epitaxial LED structure disposed on a substrate, such as a silicon substrate upon which the epitaxial LED structure was grown. The device wafer structure further includes a layer of a non-reactive barrier metal disposed over the epitaxial LED structure. In one example, the layer of non-reactive barrier metal is a single layer of titanium that is more than 50 nm thick. In one example, the eutectic metal layer involves a first gold sublayer, a gold/tin sublayer, and a second gold sublayer, where the gold/tin sublayer is disposed between the two gold sublayers. When the eutectic metal layer melts, the non-reactive barrier metal layer prevents tin from the eutectic layer from diffusing through the non-reactive barrier layer. In one specific example, there is a highly reflective layer of silver disposed between the epitaxial LED structure and the non-reactive barrier metal layer. This silver layer provides a mirror function, and also serves as an electrical contact to the epitaxial LED structure. The non-reactive barrier metal layer prevents tin from the eutectic bonding metal layer from passing into this silver layer during the wafer bonding process. Were the tin allowed to diffuse into the silver mirror, then the reflectivity of the silver mirror might be decreased and the contact resistivity of the silver contact might be increased.

In a first advantageous aspect, a high temperature cycle that melts the eutectic metal layer involves heating the carrier wafer structure to a temperature of more than 280° C. (e.g., 310° C.), and maintaining this temperature for more than one minute. In a second advantageous aspect, there is at least one layer of platinum disposed between the epitaxial LED structure and the carrier of the carrier wafer structure, and the sum of all the thicknesses of all the layers of platinum between the epitaxial LED structure and the carrier is less than 200 nm. In a third advantageous aspect, there is one and only one layer of platinum between the epitaxial LED structure and the carrier. This platinum layer serves a silver-encapsulating function to prevent the electromigration of silver. The platinum encapsulation layer has a thickness of less than 200 nm. Wafer bonding results in a wafer bonded structure. After wafer bonding, the silicon substrate of the device wafer structure is removed, electrodes are added to the remaining wafer bonded structure, and the wafer bonded structure is singulated to form blue LED devices.

Platinum is a quite expensive metal, whereas titanium is substantially less expensive. The prior art wafer bonding process described above in the background section involves five or more platinum layers, each of which may be 100 nm or more in thickness. The prior art process uses 500 nm or more of platinum. By reducing the amount of platinum used to a single layer that is thinner than 200 nm, the novel non-reactive metal bonding process disclosed here can reduce the cost of manufacturing blue LEDs on silicon substrates.

In a third novel aspect, a blue LED device is manufactured by epitaxially growing an n-type Gallium-Nitride (GaN) layer over a silicon substrate using Zinc-Sulfide (ZnS) as a transitional buffer layer. In one example, the ZnS buffer layer is 50 nm thick, and the n-type GaN layer is at least 2000 nm thick. Growing the n-type GaN layer on the ZnS buffer layer reduces lattice defect density in the n-type GaN layer. First, the ZnS buffer layer provides a good lattice constant match with the silicon substrate and a compound polar template for subsequent GaN growth. Second, ZnS can be easily prepared by metal-organic chemical vapor deposition (MOCVD) such that all the epilayers are grown in one growth chamber. Third, the melting point of ZnS is 1850° C., which is high enough to keep it from becoming unstable during GaN deposition. Finally, if an aluminum-nitride (AlN) layer is also used as part of the buffer layer, then the ZnS layer is used as a diffusion barrier between the AlN layer and the silicon substrate. After the epitaxial layers of the epitaxial LED structure are formed, a carrier wafer structure is wafer bonded to the structure where the carrier wafer structure includes a conductive carrier. The original silicon substrate and the ZnS buffer layer are then removed from the wafer bonded structure. Electrodes are added and the wafer bonded structure is singulated to form finished LED devices.

In a fourth novel aspect, a vertical GaN-based blue LED device has an n-type layer that comprises multiple conductive intervening layers. In one example, the n-type layer contains a plurality of periods, and each period of the n-type layer includes a gallium-nitride (GaN) sublayer and an aluminum-gallium-nitride doped with a silicon (AlGaN:Si) intervening sublayer. In one example, each GaN sublayer has a thickness of 900 nm, each AlGaN:Si intervening sublayer has a thickness less than 25 nm. Because AlGaN has a smaller lattice constant than GaN, the AlGaN:Si intervening layers provide a compressive strain to the GaN sublayers and prevent cracking. After each intervening layer, the quality of the overlying GaN sublayer is of improved quality in terms of lower density of lattice defects. In addition, the AlGaN:Si layers are electronically conductive (e.g., $1 \times 10^7$ to $1 \times 10^9$ defects per $cm^3$) and have a silicon concentration greater than $1 \times 10^{18}$ atoms/$cm^3$. After the epitaxial layers of the epitaxial LED structure are formed, a carrier wafer structure is wafer bonded to the device wafer structure where the carrier wafer includes a conductive carrier. The original silicon substrate of the wafer bonded structure is then removed. Electrodes are added, and the wafer bonded structure is singulated to form finished LED devices. Because the AlGaN:Si intervening sublayers are conductive (e.g., resistivity=$1 \times 10^{-2} \cdot \Omega \cdot cm$), they do not need to be removed in the final LED device. Rather, the entire n-type layer remains in the completed blue LED device and has a thickness of at least two thousand nanometers to provide enhanced current spreading and to provide more n-GaN material to accommodate surface roughening.

In a fifth novel aspect, a layer of either zinc telluride (ZnTe) or titanium dioxide ($TiO_2$) is formed directly on a silicon substrate as a buffer layer. A layer of AlN, or a layer of another suitable buffer layer material, is then optionally formed over the ZnTe layer as a second layer of the buffer layer. A template layer of GaN is then formed over the buffer layer. An epitaxial LED structure is formed over the template layer. The epitaxial LED structure is the epitaxial LED structure for a GaN blue LED. It therefore has an active layer comprising gallium and nitrogen. The resulting structure is referred to as a first multilayer structure. A conductive carrier is then bonded to the first multilayer structure. The silicon substrate and the buffer layer are then removed, thereby forming a second multilayer structure. Electrodes are formed on the second multilayer structure, and the structure is singulated to form blue LED devices.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIGS. 19A and 19B together are a table that sets forth details about each of the steps in the method of manufacturing of FIGS. 6-18.

DETAILED DESCRIPTION

Reference will now be made in detail to some embodiments of the invention, examples of which are illustrated in the accompanying drawings. In the description and claims below, when a first layer is referred to as being disposed "over" a second layer, it is to be understood that the first layer can be directly on the second layer, or an intervening layer or layers may be present between the first and second layers. The terms such as "over", "under", "upper", "lower", "top", "bottom", "upward", "downward", "vertically", and "laterally" are used herein to describe relative orientations between different parts of the blue LED device being described, and it is to be understood that the overall blue LED device being described can actually be oriented in any way in three-dimensional space.

Figure 1:
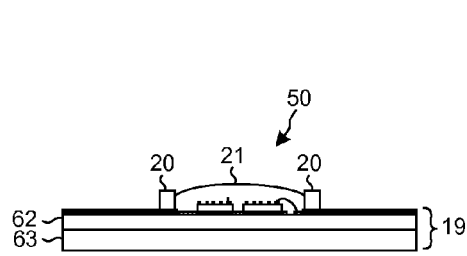
FIG. 1 is a cross-sectional diagram of a white LED assembly in accordance with one novel aspect.
Figure 2:
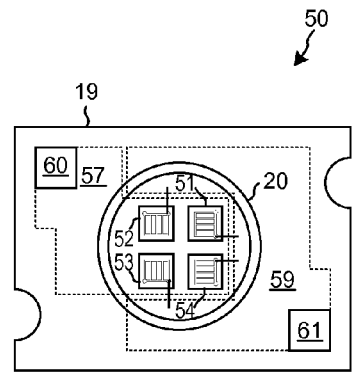
FIG. 2 is a top-down diagram of the white LED assembly of FIG. 1.

FIG. 1 is a cross-sectional side view of a white light emitting diode (LED) assembly 50. FIG. 2 is a top-down diagram of the white LED assembly 50. The white LED assembly 50 includes four vertical blue LED devices 51-54. A vertical LED device is also sometimes referred to as a vertically-contacted LED device to distinguish it from a lateral or a laterally-contacted LED device. The four vertical blue LED devices 51-54 are mounted to a metal core printed circuit board (PCB) 19. From the top-down perspective, the four vertical blue LED devices 51-54 are surrounded by a retaining ring 20. The retaining ring 20 retains an amount of phosphor 21 that covers the blue LED devices 51-54. A portion of a first metal structure 57 is exposed through a first opening in a solder mask layer 58. Anode electrodes of the blue LED devices 51-54 are surface mounted via amounts of silver epoxy 18 to the first metal structure 57 in this first opening. The first opening in the solder mask layer 58 also exposes a portion of a second metal structure 59. Upwardly facing cathode electrodes of the blue LED devices 51-54 are wirebonded to the exposed portion of the second metal structure 59. A first pad 60 is formed by another opening in solder mask layer 58. A second pad 61 is formed by yet another opening in solder mask layer 58. As illustrated in the cross-sectional view of FIG. 3, the first and second metal structures 57 and 59 are portions of a metal layer that is disposed on a dielectric layer 62. Dielectric layer 62 is a 35 um to 250 um thick layer of an epoxy material containing inorganic fillers such as $Al_2O_3$. This dielectric layer 62 insulates the first and second metal structures 57 and 59 from an aluminum or copper base portion 63 of the metal core PCB 19.

Figure 3:
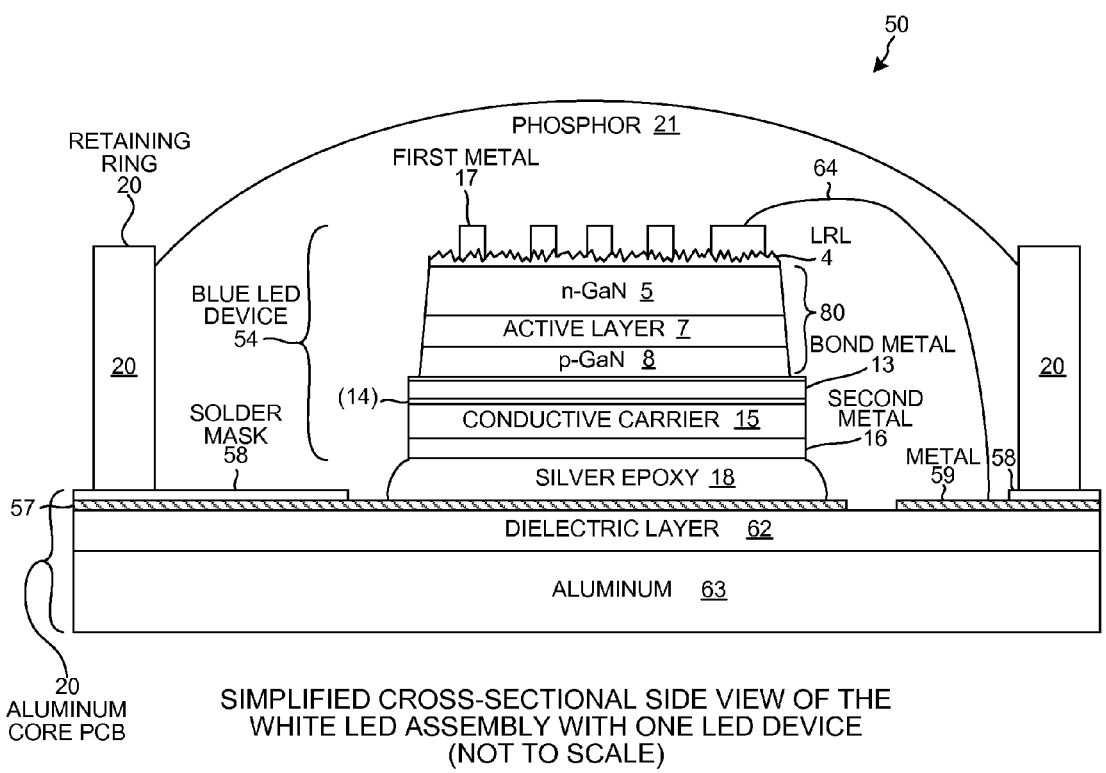
FIG. 3 is simplified and expanded cross-sectional diagram of the white LED assembly of FIG. 1.

FIG. 3 is a simplified cross-sectional side view of the white LED assembly 50. Only one vertical blue LED device 54 is illustrated in the diagram. The vertical blue LED device 54 includes numerous layers, some of which are illustrated in FIG. 3: a first metal electrode 17, a portion of a Low Resistance Layer (LRL) 4, an n-type gallium-nitride layer 5, an active layer 7, a p-type gallium-nitride layer 8, an amount of metal including a bond metal layer 13, a conductive carrier 15 and a second metal electrode 16. Reference numeral 64 identifies a wire bond that couples the first metal electrode 17 of the blue LED device 54 to the second metal structure 59. Metal 17 and LRL 4 are conductive and function to make electrical contact to the n-type layer 5. All the layers below p-type layer 8 (including layers 13, 15, 16) are conductive and function to make electrical contact to the p-type layer 8.

Figure 4:
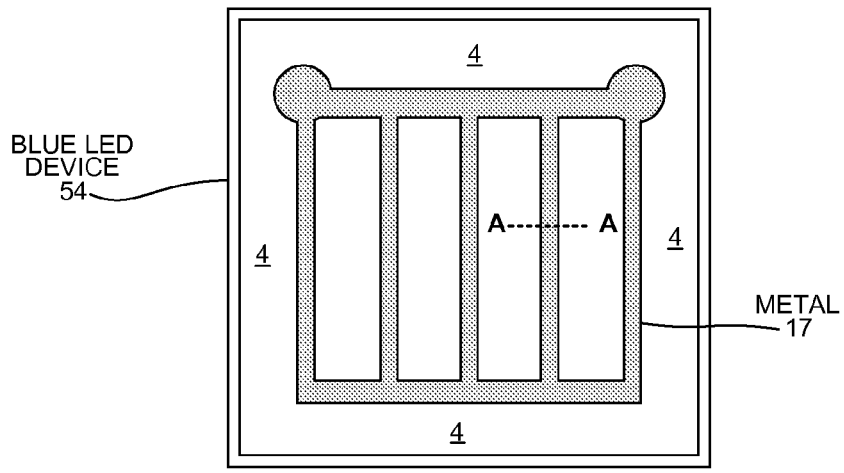
FIG. 4 is a top-down diagram of the blue LED device of the white LED assembly of FIG. 1.

FIG. 4 is a top-down diagram of the vertical blue LED device 54. The first metal electrode 17 has a grid shape.

Figure 5:
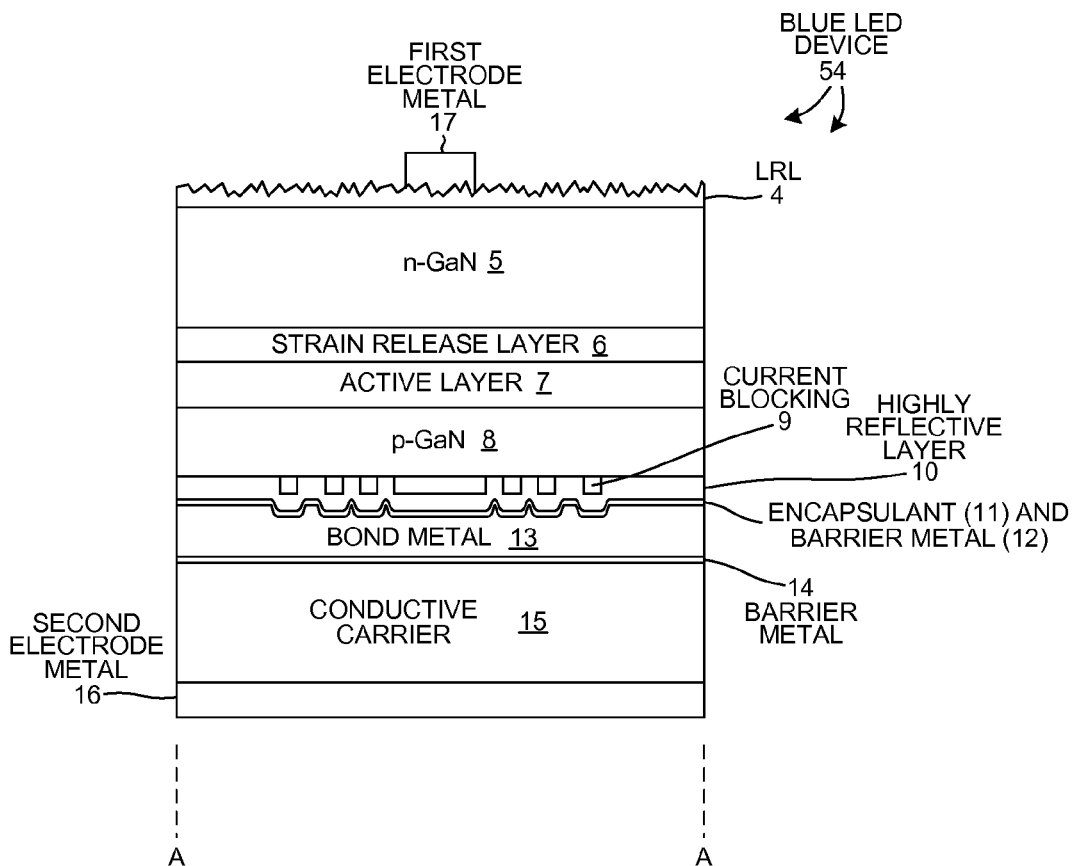
FIG. 5 is a cross-sectional diagram of a portion of the blue LED device of the white LED assembly of FIG. 1.

FIG. 5 is a more detailed cross-sectional diagram of the vertical blue LED device 54 taken along sectional line A-A in FIG. 3. Between the conductive carrier 15 and the p-type gallium-nitride 8 are multiple layers and structures including: a barrier metal layer 14, the bond metal layer 13, a barrier metal layer 12, a layer of an encapsulant metal 11, a highly reflective layer 10, and a current blocking layer 9. The current blocking layer 9 is patterned into current blocking structures. Between the active layer 7 and the n-type gallium-nitride layer 5 is a strain release layer 6. When current flows from the second electrode 16, through conductive carrier 15, through the metal layers 14, 13, 12, 11 and 10, through p-type gallium-nitride layer 8, through active layer 7, through strain release layer 6, through n-type gallium-nitride layer 5, through the Low Resistance Layer 4, and to the first electrode 17, then non-monochromatic and non-coherent light is emitted from the active layer 7. The emitted light has a wavelength in a range of from approximately 440 nm to approximately 490 nm. The term "non-monochromatic" as it is used herein means that the light has a spectral line width that is substantially wider than the spectral line width of the light emitted by a typical laser diode. The spectral line width of an LED is typically around 20 nm wide, whereas the spectral line width of a laser diode is typically less than 4.0 nm wide.

FIGS. 6-18 are a set of diagrams that set forth steps in a method of manufacturing the blue LED device 54. The diagrams are not to scale, but rather are conceptual diagrams.

Figure 6:
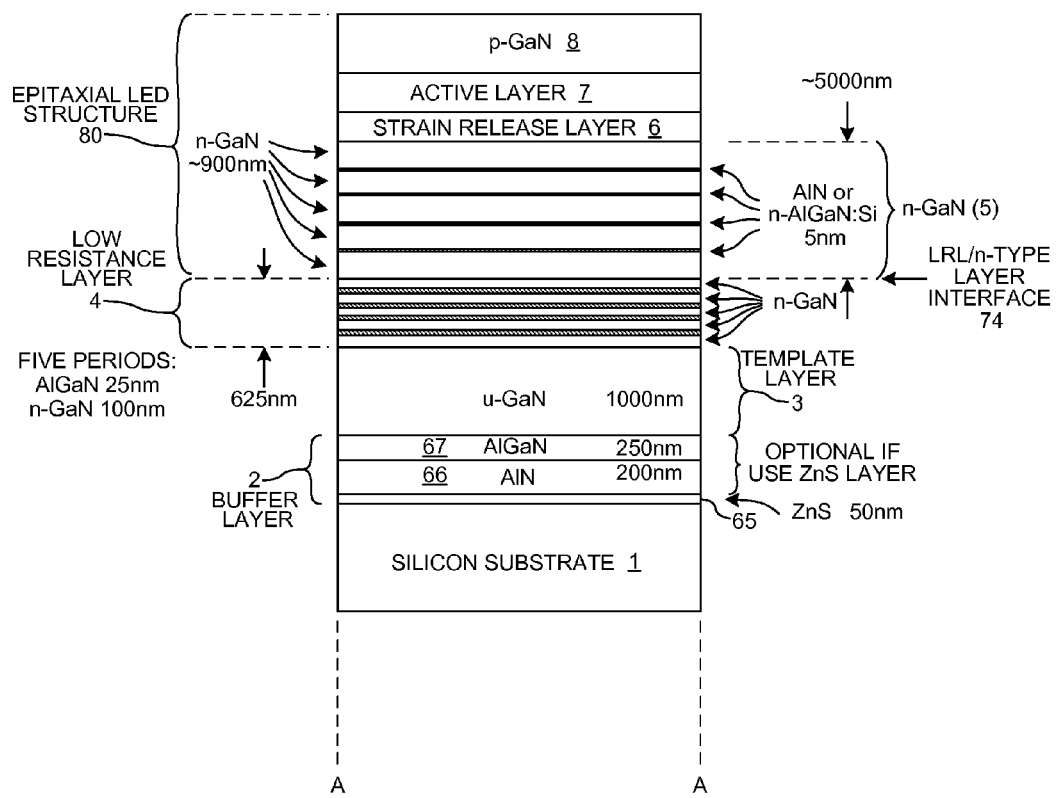
FIG. 6 is a cross-sectional diagram of the epitaxial PAN structure layers of the blue LED device of FIG. 3 formed on a silicon substrate.

FIG. 6 is a cross-sectional diagram that shows the result of several initial steps of forming epitaxial layers on a silicon substrate 1. Silicon substrate 1 is a monocrystalline silicon substrate wafer of the type commonly used in the manufacture of high volume CMOS integrated circuits. A buffer layer 2 is formed on the silicon substrate. In the illustrated example, the forming of this buffer layer 2 involves first forming a less than 100 nm thick layer 65 of zinc-sulfide (for example, 50 nm) on silicon substrate 1. A 200 nm thick layer 66 of aluminum-nitride (AlN) is then formed on the ZnS layer 65. A 250 nm thick layer 67 of aluminum-gallium-nitride (AlGaN) is then formed on the AlN layer 66. Although this particular buffer layer involving a layer of zinc-sulfide is shown, other types of buffer layers can be used. A buffer layer of a single layer of AlN may, for example, be used. Where the ZnS layer 65 is provided, the AlN layer 66 and the AlGaN layer 67 illustrated in FIG. 6 are optional.

The manufacturing of vertical LED device 54 involves epitaxially later growing a gallium-nitride (GaN) layer (e.g., n-type GaN layer 5) over silicon substrate 1. The in-plane lattice constants of GaN and Si are aGaN(0001)=3.189 Å, and aSi(111)=3.840 Å, respectively. As a result, there is a substantial 20.4% in-plane lattice mismatch between GaN and Si. This lattice mismatch, combined with a large difference in the thermal expansion coefficient between GaN and Si (e.g., 56%), makes growing high quality, thick, and crack-free GaN on silicon substrate a challenge. In general, using a transitional buffer layer satisfying coincident lattice conditions can alleviate the lattice mismatch. For example, an AlN layer 66 (aAlN=3.112 Å) is often used as a buffer layer to provide a compression to a GaN epilayer. However, inter diffusion of Al and Si at the interface is severe, resulting in high unintentional doping levels. Moreover, AlN crystal quality is low because the lattice mismatch between AlN and Si is even higher than the lattice mismatch between GaN and Si.

To overcome this drawback, ZnS layer 65 is used as a new transitional buffer layer. First, Wurzite ZnS compound (aZnS=3.811 Å) has a lattice constant of 0.3811, which is between the lattice constant of GaN and Si, and is closer to the lattice constant of Si. ZnS thus provides a good lattice constant match with Si and is also a compound material like GaN. Second, ZnS can be easily prepared by metal-organic chemical vapor deposition (MOCVD) such that all the epilayers are grown in one growth chamber. MOCVD is a chemical vapor deposition method of epitaxial growth of materials, especially compound semiconductors from the surface reaction of organic compounds or metalorganics and metal hydrides containing the required chemicals. In one example, ZnS is grown on a silicon substrate in an MOSCVD chamber by introducing hydrogen sulfide with dimethyl zinc (DMZn), under 350° C. growth temperature and 100 Torr growth pressure. Third, the melting point of ZnS is 1850° C., which is high enough to keep it from becoming unstable during GaN deposition. Finally, if an AlN layer is also used as part of the buffer layer, then ZnS also serves as a diffusion barrier between AlN of the buffer and the silicon substrate.

A template layer 3 is then formed on the buffer layer 2. In the illustrated example, template layer 3 is a 1000 nm thick layer of undoped gallium-nitride.

Rather than growing the n-type layer of the LED directly on the template layer, the Low Resistance Layer (LRL) 4 is grown directly on the template layer 3. In the illustrated example, LRL 4 is a superlattice structure that is structured so that a two-dimensional gas of high mobility electrons is formed in its layers. The superlattice structure includes multiple periods, where each period is less than 300 nm thick. In one specific example, each period includes a 100 nm thick n-type gallium-nitride sublayer and a 25 nm thick undoped aluminum-gallium-nitride sublayer. In the perspective of the illustration of FIG. 6, a 100 nm thick n-GaN sublayer is disposed directly on template layer 3. Also, the uppermost sublayer of the LRL 4 is a 100 nm thick n-GaN sublayer. There are five GaN sublayers and four AlGaN sublayers in the configuration illustrated. The n-GaN layers are doped with silicon to a concentration of $1 \times 10^{18}$ atoms/cm$^3$. Each of the thinner AlGaN sublayers is strained to the lattice of a thicker GaN sublayer or sublayers.

The n-type GaN layer 5 is then grown on LRL 4. It is difficult to grow a thick layer of high quality GaN that has a low lattice defect density and that does not suffer from cracking and other problems due to the buildup of stresses in the GaN layer. For example, there exists a large difference in thermal expansion coefficient (e.g., 56%) between GaN and Si. This thermal mismatch usually causes tensile stress in the GaN epilayer during cool down. When the thickness of the GaN epilayer is larger than 1000 nm, cracks usually occur. Although the exact reasons for the buildup of stress as a GaN layer grows thicker are not fully understood, it is empirically known that cracking may be prevented by stopping the growth of the GaN layer just before the buildup of stress in the GaN layer would result in cracking. At this point, a thin intervening layer is grown on the top of the GaN layer. This intervening layer may, for example, be a 5 nm thick layer of AlN. After the formation of the thin intervening sublayer, another sublayer of GaN is grown on the intervening layer. This second GaN sublayer is grown to be as thick as possible without the GaN sublayer having too much internal stress. This periodicity is repeated multiple times. After each intervening layer, the quality of the overlying GaN sublayer is of improved quality in terms of lower density of lattice defects. For example, typical GaN over Si has a defect density as high as $1 \times 10^{10}$ defects per cm$^3$. The defect density of improved quality GaN over Si is in the range from $1 \times 10^7$ to $1 \times 10^9$ defects per cm$^3$.

The use of AlN intervening sublayers, however, leads to one problem. AlN is an insulating material due to its wide bandgap (e.g., 6.2 eV) and therefore creates a barrier for current transportation in the vertical direction. As a result, all the sublayers from the silicon substrate to the top AlN intervening sublayer have to be removed if a vertical LED is to be made. The current spreading function of these layers is therefore not present in the final LED device. The GaN sublayer over the top AlN sublayer is usually less than 2000 nm, which could cause a current crowding problem in LED devices. To solve this problem, a thin AlGaN:Si layer is used as a new intervening sublayer instead of using AlN. First, AlGaN:Si is an n-type material the allows electron transportation through it because AlGaN has smaller band energy (e.g., bandgap of 3.4 eV to 6.2 eV, depending on the Al concentration) than that of AlN, thus the activation energy of Si in AlGaN is smaller than that of Si in AlN. As a result, the AlGaN:Si intervening sublayers are electronically conductive and do not need to be removed in the final LED device. One example of the resistivity of the conductive AlGaN:Si layer is $1 \times 10^{-2} \cdot \Omega \cdot cm$. Second, AlGaN has a smaller lattice constant than GaN and therefore provides compressive strain to the subsequent GaN sublayers and helps prevent cracking.

In the example of FIG. 6, each of the GaN sublayers of n-type GaN layer 5 has a thickness of about 900 nm and is doped with silicon at a concentration of $5 \times 10^{18}$ atoms/cm$^3$. Each of the intervening sublayers of AlGaN:Si less than 25 nm in thickness (for example, 5 nm) with a silicon dopant concentration of $1 \times 10^{18}$ atoms/cm$^3$. These AlGaN:Si intervening sublayers are relatively conductive, and the n-type GaN intervening sublayers are conductive, so the overall n-type GaN layer 5 can effectively conduct current in the direction from the LRL/n-type layer interface toward the active layer. The bottom sublayer of n-type GaN layer 5 that is in direct contact with LRL 4 is a 900 nm thick GaN sublayer as illustrated. The upper sublayer of the n-type gallium-nitride layer 5 is also a 900 nm sublayer of GaN as illustrated. The entire n-type GaN layer 5 with multiple AlGaN:Si conductive intervening sublayers is approximately 5000 nm thick, where each n-GaN sublayer is substantially thicker than the n-GaN sublayers of LRL 4.

There is an interface 74 between the n-type GaN layer 5 and the underlying LRL 4. The n-type GaN layer 5 has a sheet resistance at this interface that is greater than 15 ohms per square. The LRL 4 also has a sheet resistance at this interface, but the sheet resistance of LRL 4 is lower than the sheet resistance of the n-type GaN layer 5. In one example, the sheet resistance of LRL 4 can be destructively measured by grinding away the upper layers of a first LED device to expose a surface of LRL 4 at interface 74, and then probing the exposed LRL surface and measuring its sheet resistance. In a similar fashion, the sheet resistance of n-type layer 5 can be destructively measured by grinding away the lower layers of a second LED device to expose a surface of n-type layer 5 at interface 74, and then probing the exposed n-type layer surface and measuring its sheet resistance.

Next, a strain release layer 6 is formed on the n-type GaN layer 5. In one example, strain release layer 5 is 120 nm thick and includes thirty periods. Each period includes a first sublayer of $In_xGa_{1-x}N$, where $0 \leq x \leq 0.12$ and a second sublayer of $In_yGa_{1-y}N$ where $0 \leq y \leq 0.12$, where $x \neq y$.

Next, the active layer 7 is formed on the strain release layer 6. The active layer 7 is fashioned to emit blue light in the overall blue LED device. In one example, active layer 7 is a 130 nm thick Multiple Quantum Well (MQW) structure that has ten periods. Each period includes a 3 nm thick InGaN sublayer (15% In), and a 10 nm thick GaN sublayer. The active layer 7 emits non-monochromatic light having a wavelength in the range of approximately 440 nm to approximately 490 nm.

Next, the p-type GaN layer 8 is formed on the active layer 7. In one example, the p-type GaN layer is 300 nm thick and has a magnesium dopant concentration of $1 \times 10^{20}$ atoms/cm$^3$. In this example, the upper surface of p-type GaN layer 8 is formed so that the completed LED device will emit non-monochromatic light and will include no current focusing ridge structures of the type used in laser diodes. The n-type layer 5, the p-type layer 8, and all layers in between including active layer 7 together are an epitaxial LED structure 80.

Figure 7:
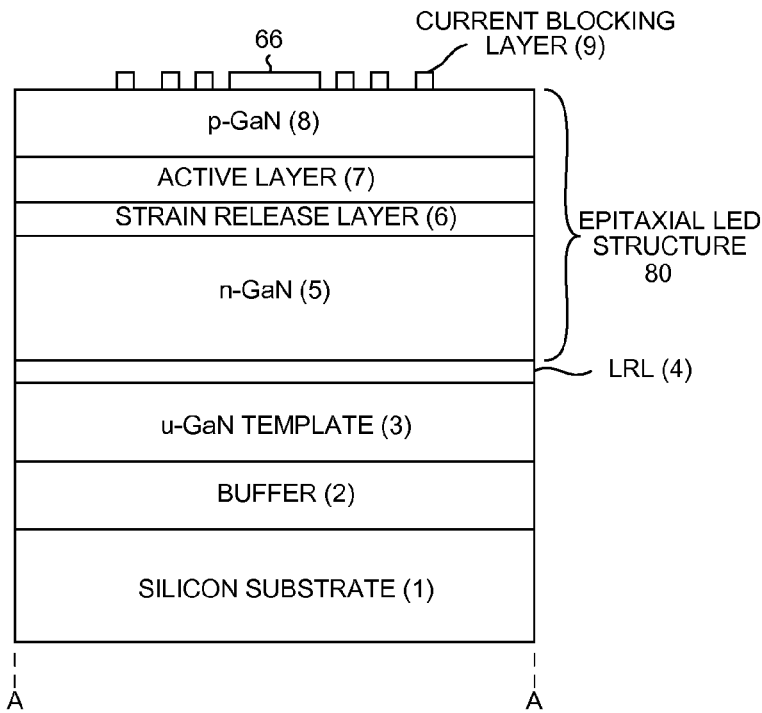
FIG. 7 is a diagram that illustrates a step in a method of manufacturing where current blocking structures are added to the structure of FIG. 6.

FIG. 7 is a cross-sectional diagram that shows a subsequent step in the method of manufacture. A current blocking layer of an insulating material is formed on the upper surface of the p-type GaN layer 8. In one example, the current blocking layer is a patterned 200 nm thick layer of silicon dioxide. This silicon dioxide layer is deposited and patterned using photolithographic techniques to form structures that obstruct current flow in some places more than in other places. For example, the large structure 66 of the current blocking layer is disposed directly under the location where the first electrode 17 will be formed later in the manufacturing method. The large structure 66 is placed in this location so that current will not flow through the active layer directly underneath the first electrode 17, and therefore will not generate light directly under the first electrode 17. Had light been generated in the active region directly underneath the first electrode, then a large amount of that light might be blocked by the metal first electrode 17 from escaping the LED device. The blocked light might be reabsorbed in the LED without ever escaping the LED as usable light. The current used to generate that blocked light would therefore be wasted. By blocking current from flowing through the portion of the active layer directly under the first electrode 17, this current is made to flow through the active layer in other places where the resulting light has a better chance of escaping the LED device as useful light. By blocking an appropriate proportion of each sub-area of the upper surface area of the p-type layer 8, and by properly varying this proportion across from sub-area to sub-area across the upper surface area of the p-type layer 8, the amount of current flowing through each individual sub-area is controlled to maximize light output from the LED device as compared to current flow through the overall LED device.

Figure 8:
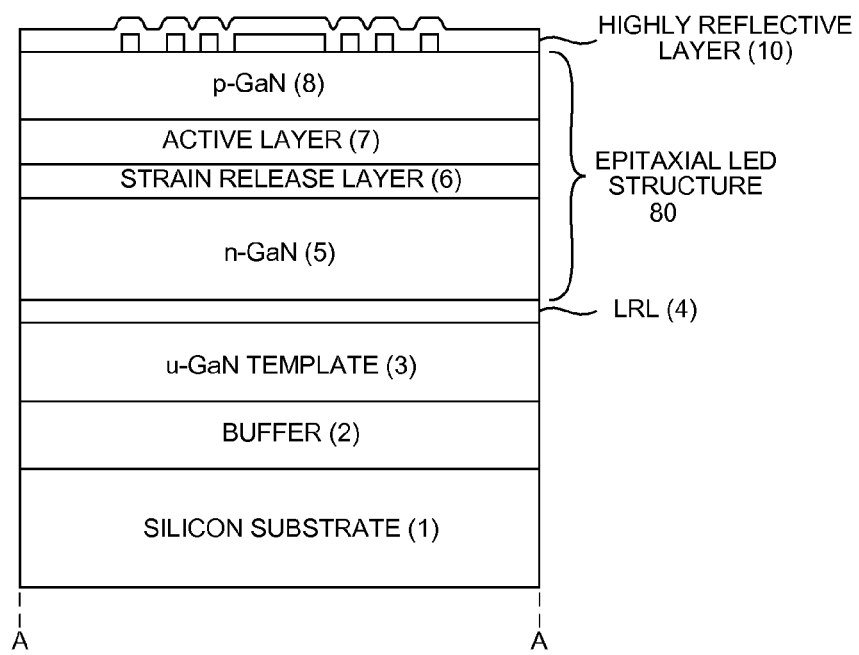
FIG. 8 is a diagram that illustrates a step in the method of manufacturing where a highly reflective layer is added to the structure of FIG. 7.

FIG. 8 is a cross-sectional diagram that shows a subsequent step in the method of manufacture. A highly reflective layer 10 is deposited over the current blocking layer 9. In one example, highly reflective layer 10 is a 200 nm thick layer of silver that makes ohmic contact with the p-type GaN layer 8. This silver layer does not cover the entire LED device wafer. The highly reflective layer 10 is shown covering the entire structure of FIG. 8 because the cross-section of FIG. 8 is a cross-section of only a part of the LED device along line A-A. Highly reflective layer 10 serves a first function of acting as a mirror to reflect light and serves a second function of making electrical contact to the p-type layer 8.

Figure 9:
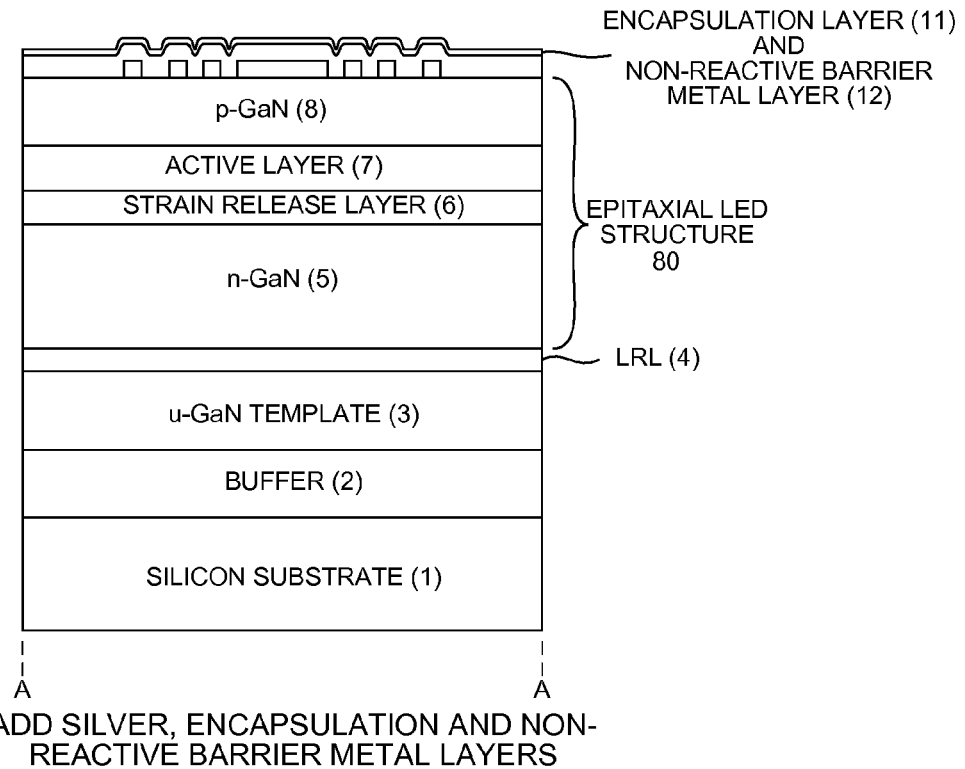
FIG. 9 is a diagram that illustrates a step in the method of manufacturing where an encapsulation layer is formed over the structure of FIG. 8, and where a non-reactive barrier metal layer is formed over the encapsulation layer.

FIG. 9 is a cross-sectional diagram that shows a subsequent step in the method of manufacture. An encapsulation layer 11 covers the silver layer 10. In the illustrated example, encapsulation layer 11 is a 100 nm thick layer of platinum. This layer of platinum blocks the electromigration of silver. In one advantageous aspect, this layer of platinum is the only layer of platinum in the blue LED device. The sum of all the thicknesses of all platinum layers of the blue LED device (there is only one layer of platinum) is less than 200 nm.

After encapsulation layer 11 is formed, a non-reactive barrier metal layer 12 more than 50 nm thick is formed over the encapsulation layer. In the illustrated example, the non-reactive barrier metal layer 12 is a 200 nm thick layer of titanium. The titanium is a barrier in that it is a barrier to the diffusion of tin. Tin, from a bond metal layer to be later applied to the top of the structure, is blocked by the barrier layer from diffusing into the silver of layer 10. Some other metals such as platinum, titanium/tungsten, gold and nickel that are sometimes used as barriers for tin, are actually somewhat reactive with tin. In other bonding processes that use such reactive metals as barriers, the combination of the thickness of the reactive metal provided and the limited time of the high temperature bonding cycle is such that the amount of tin incursion is kept within acceptable levels. The non-reactive barrier metal of layer 12, in contrast, is not such a reactive metal and in one example is a layer of titanium that is more than 50 nm thick.

Figure 10:
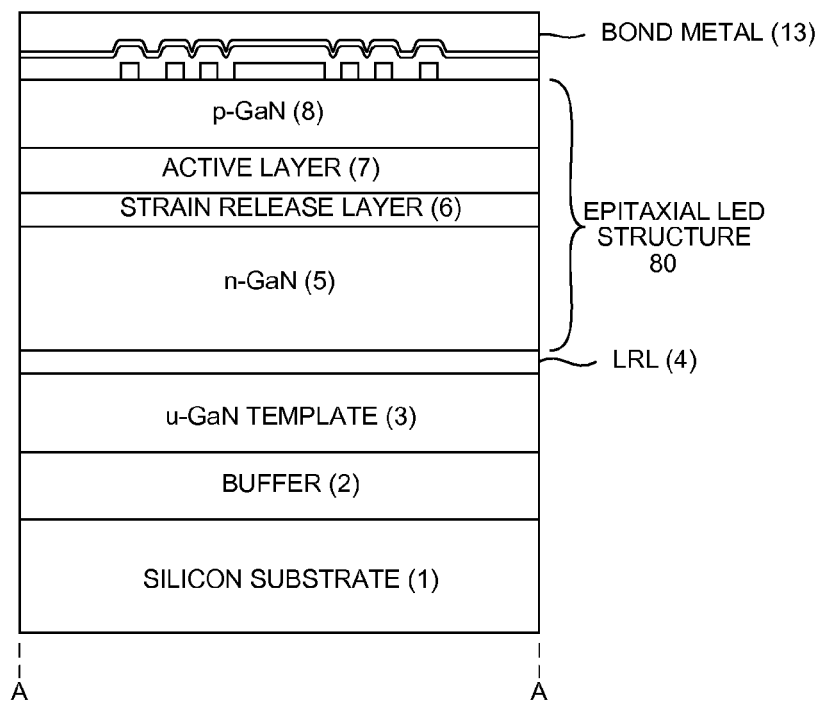
FIG. 10 is a diagram that illustrates a step in the method of manufacturing where bond metal is added to the structure of FIG. 9.

FIG. 10 is a cross-sectional diagram that shows a subsequent step in the method of manufacture. A 500 nm thick sublayer of gold is formed to cover the top of non-reactive barrier metal layer 12. Reference numeral 13 in FIG. 10 denotes this gold sublayer that is one sublayer of three-sublayer Au/AuSn/Au sandwich structure of metal layers.

Figure 11:
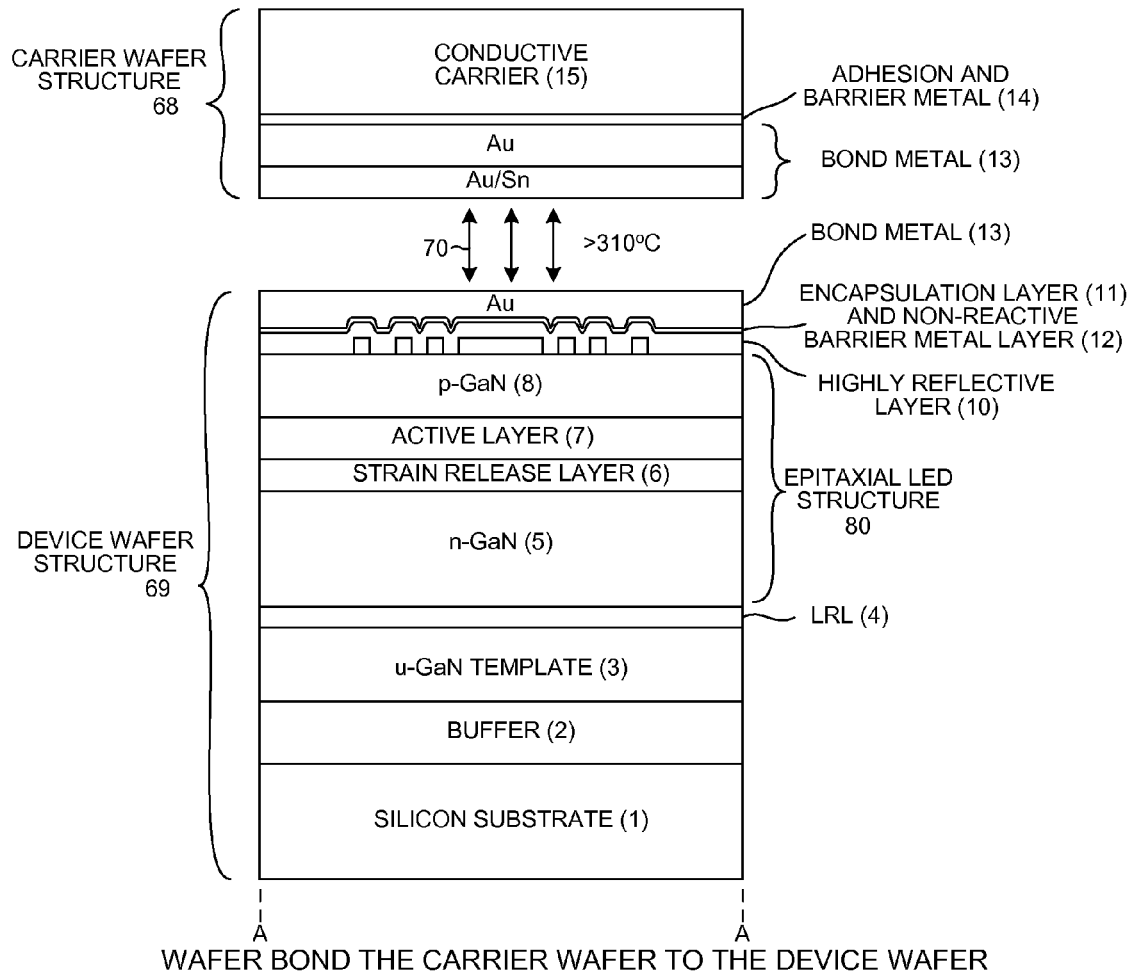
FIG. 11 is a diagram that illustrates a step in the method of manufacturing where a carrier wafer structure is wafer bonded to the structure of FIG. 10.

FIG. 11 is a cross-sectional diagram that shows a subsequent step in the method of manufacture. The conductive carrier 5 is covered with an adhesion and barrier metal layer 14. In the illustrated example, the conductive carrier is a monocrystalline silicon wafer and the adhesion and barrier metal layer 14 is a 200 nm thick layer of titanium. Gold does not generally bond well to silicon, but titanium does, so the titanium layer 14 is provided to bond to the conductive silicon carrier 15 so that a subsequent sublayer of gold (part of the bond metal layer 13) can then in turn bond to the titanium. In addition to this adhesion function, the titanium also acts as a barrier to prevent tin and gold from diffusing to the silicon surface and degrading the adhesion. In another example, the adhesion/barrier metal layer 14 also includes a layer of platinum disposed over the titanium.

A 500 nm thick sublayer of gold is then formed on the adhesion and barrier metal layer 14, and a 3000 nm thick gold/tin sublayer is formed on the gold sublayer. The 3000 nm thick gold/tin sublayer is 80% gold and 20% tin by weight. These gold and gold/tin sublayers are the other two sublayers of the three-sublayer sandwich metal structure 13 mentioned above in connection with FIG. 9.

The conductive carrier 15, the barrier metal layer 14, and the gold and gold/tin sublayers 13 together are a carrier wafer structure 68. The silicon substrate 1 and the layers formed on it together are a device wafer structure 69. The carrier wafer structure 68 is wafer bonded to the gold covered upper surface of the device wafer structure 69.

Figure 12:
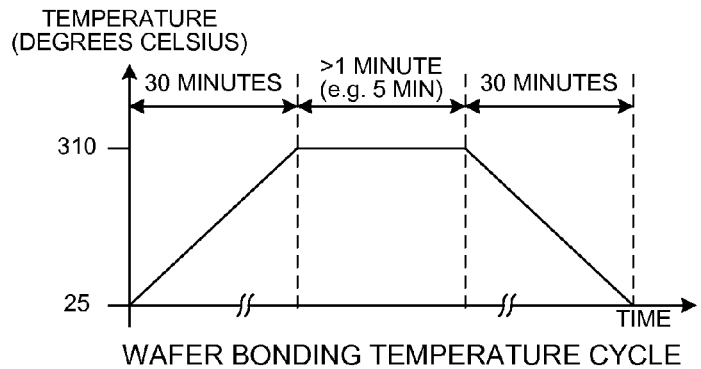
FIG. 12 is a graph that shows the temperature cycle of the thermal compressing wafer bonding process used.

FIG. 12 is a graph showing the temperature cycle of the thermal compression wafer bonding process used. Carrier wafer structure 68 is pressed against device wafer structure 69 with a pressure of approximately fifty pounds per square inch and the pressed together wafers are heated to at least 280° C. In the specific example, the wafers are heated to 310° C. The wafers remain at this elevated temperature for a period of more than one minute to ensure there is a uniform melting temperature all across the wafers. In the specific example, the elevated temperature is maintained for five minutes. The eutectic gold/tin sublayer melts, thereby wafer bonding the carrier wafer structure 68 to the device wafer structure 69. This wafer bonding is represented by arrows 70 in FIG. 11. At a twenty percent tin concentration, the gold/tin sublayer has a melting point of approximately 282° C. Once the gold/tin sublayer melts, however, some of the tin diffuses from this sublayer into the gold sublayers on either side of the gold/tin sublayer. The concentration of tin in the gold/tin sublayer therefor decreases. A gold/tin layer having a lower concentration of tin has a higher melting temperature. For every one percent that the tin concentration decreases in the gold/tin alloy, the melting temperature of the gold/tin alloy increases by approximately 30° C. Accordingly, after the wafer bonding process has been conducted, the concentration of tin in the gold/tin sublayer decreases to be below twenty percent and the overall wafer bonded structure can thereafter have its temperature raised to 282° C. without the gold/tin sublayer melting.

Figure 13:
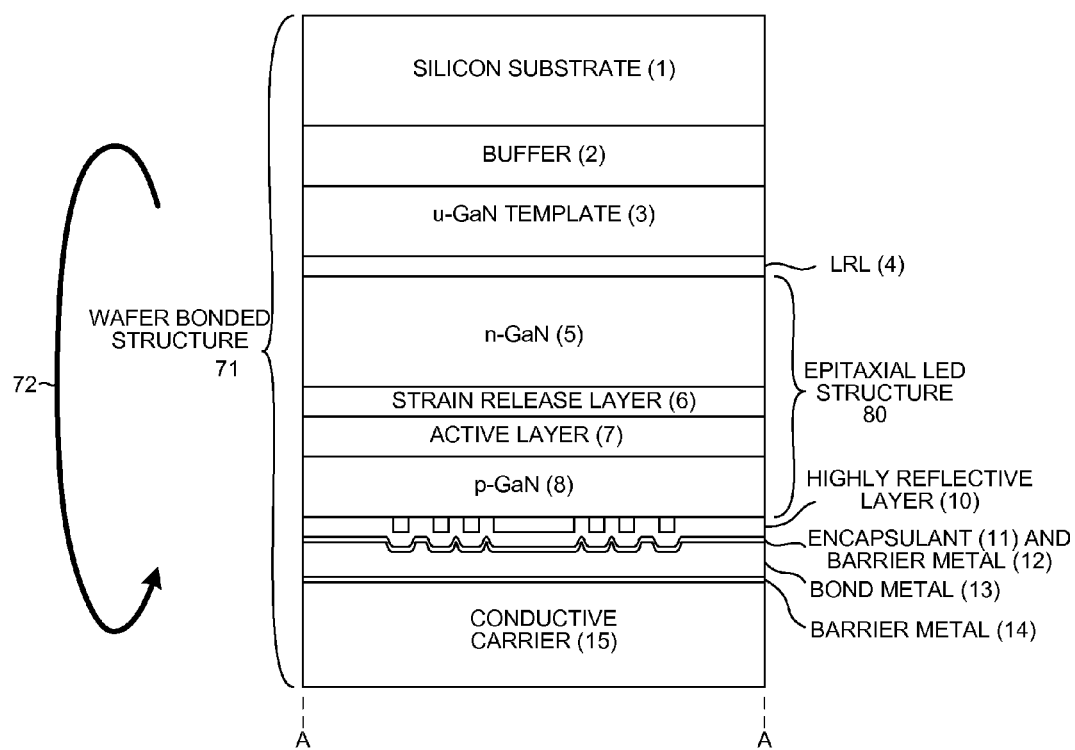
FIG. 13 is a diagram that illustrates a step in the method of manufacturing where the wafer bonded structure is flipped.

FIG. 13 shows a subsequent step in the method of manufacture. The resulting wafer bonded structure 71 is flipped as indicated by arrow 72.

Figure 14:
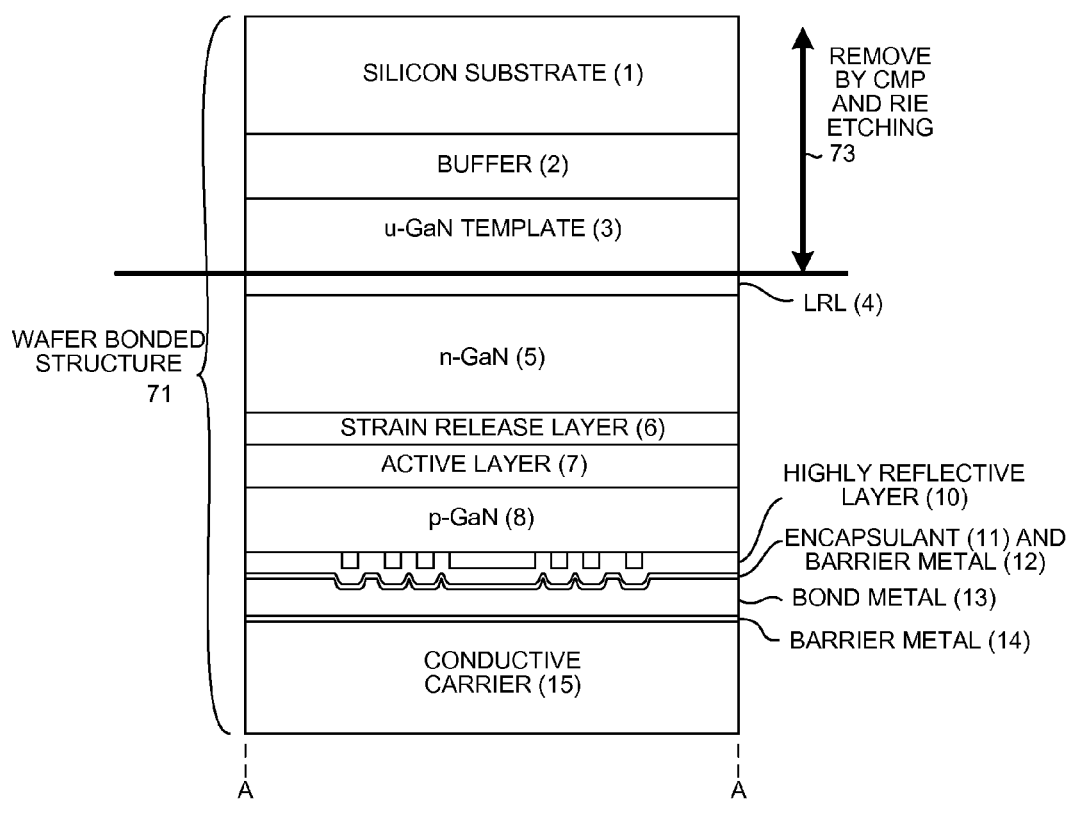
FIG. 14 is a diagram that illustrates a step in the method of manufacturing where the silicon substrate, the buffer layer, and the template layer are removed from the structure of FIG. 12.

FIG. 14 shows a subsequent step in the method of manufacture. The silicon substrate 1, the buffer layer 2 and the template layer 3 are removed from wafer bonded structure 71 as indicated by arrow 73. In the present example, these layers are removed using chemical mechanical polishing (CMP) and reactive ion etching (RIE) techniques such that one of the GaN sublayers of LRL 4 is present and exposed at the top of the structure. The entire n-type GaN layer 5 is left as part of the wafer bonded structure 71. Due to the conductivity of the AlGaN:Si intervening sublayers within layer 5, the n-type GaN layer 5 is electrically conductive from the strain release layer to n-type layer interface, all the way through the n-type GaN layer, and to the n-type layer/LRL interface. An advantage of using AlGaN:Si for the intervening sublayers as opposed to using AlN intervening sublayers is that the AlGaN:Si intervening sublayers are conductive. There is no nonconductive intervening AlN sublayer within the n-type GaN layer that must be removed in the step of FIG. 13 in order to provide conductivity through the n-type layer. Rather, the entire n-type GaN layer 5 remains in the completed blue LED device.

Figure 15:
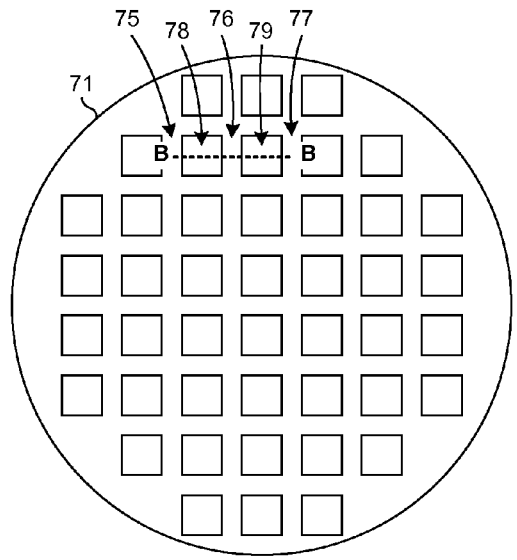
FIG. 15 is a top-down diagram of the wafer bonded structure after the removal step of FIG. 14 and after mesas have been formed.

FIG. 15 is a top-down diagram of the wafer bonded structure 71. In addition to removing the layers 1, 2 and 3 as illustrated in FIG. 14, wet etching is used to etch horizontal and vertical streets down to the encapsulation layer 11, thereby forming a two-dimensional array of rows and columns of mesa structures. Reference numerals 75, 76 and 77 identify three such streets. Reference numerals 78 and 79 identify two of the mesa structures.

Figure 16:
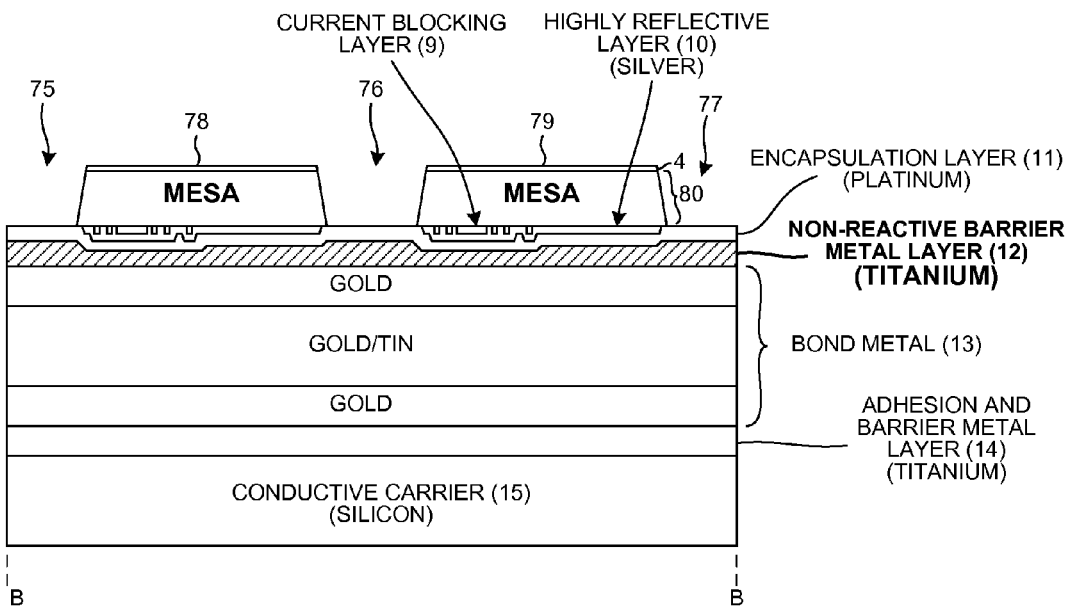
FIG. 16 is a cross-sectional diagram of FIG. 15 taken along line B-B.

FIG. 16 is a cross-sectional diagram of the structure of FIG. 15 taken along sectional line B-B. The non-reactive barrier layer 12 of titanium is shown in cross-hatching. Non-reactive barrier layer 12 is a single layer of titanium more than 50 nm thick and includes no sublayers, no platinum, and no tungsten. Silver of the highly reflective layer 10 is blocked by the encapsulation layer 11 from moving laterally out from under the mesas. The silver of the highly reflective layer 10 is contained from the top by the bottom surface of the p-type GaN layer 8 (the bottom of the mesas).

Figure 17:
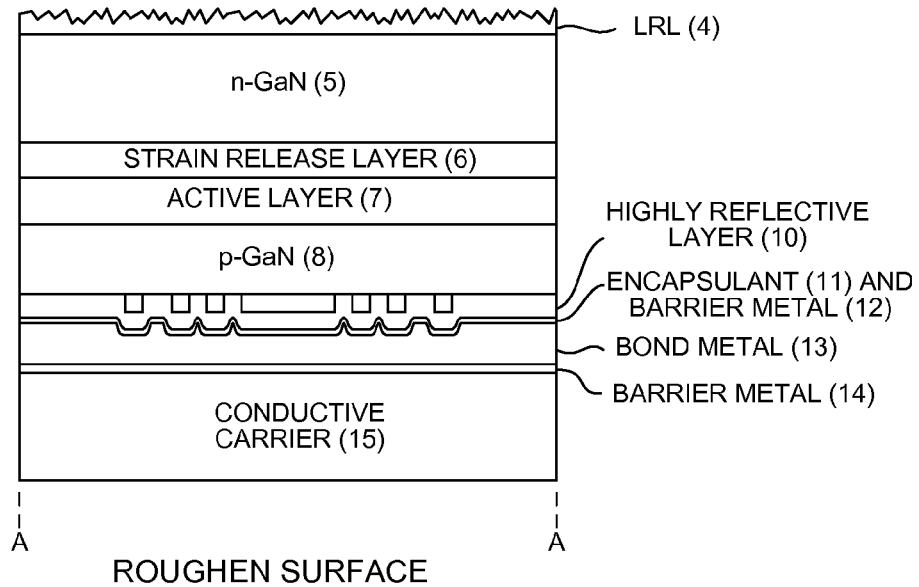
FIG. 17 is a diagram that illustrates a step in the method of manufacturing where the surface of the LRL is roughened.

FIG. 17 shows a subsequent step in the method of manufacture. The upper surface of the exposed LRL 4 at the top of each mesa is roughened. This roughening is the type of roughening customarily performed to facilitate the escape of light from the LED device. The roughening is actually more severe than is illustrated in FIG. 17. The vertical distance from the highest peak to the deepest valley of the roughened surface is approximately 500 nm, so the deepest valleys extend down into the n-type layer 5. It is desirable that the LRL not be penetrated, so in another example the amount material removed is preferably limited to removing the silicon substrate and part of the buffer layer.

Figure 18:
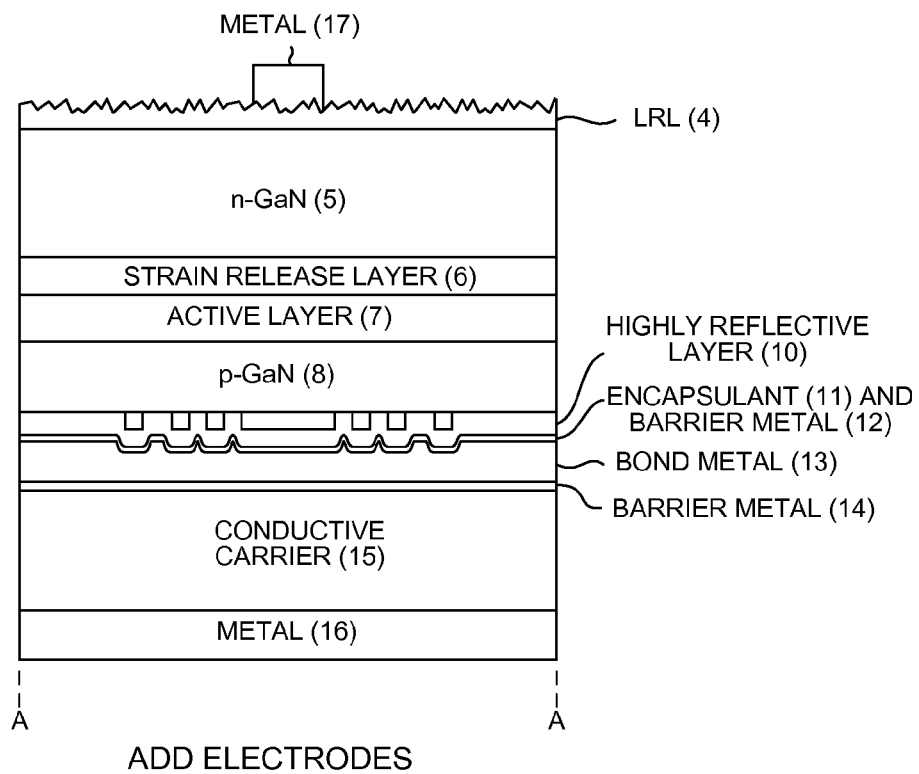
FIG. 18 is a diagram that illustrates a step in the method of manufacturing where electrodes are added to the structure of FIG. 17.

FIG. 18 shows a subsequent step in the method of manufacture. The second electrode 16 is formed on the conductive carrier 15 as illustrated. In one example, second electrode 16 includes a first 20 nm thick nickel sublayer that is in direct contact with the conductive carrier 15, and also includes a second 200 nm thick gold layer that covers the nickel sublayer. Second electrode 16 is therefore 220 nm thick.

In addition, FIG. 18 shows a subsequent step of forming the first electrode 17 on the upper surface of LRL 4 as illustrated.

In one example, first electrode 17 includes a 20 nm thick sublayer of titanium disposed directly on LRL 4, a 100 nm thick sublayer of aluminum disposed on the titanium sublayer, a 20 nm thick sublayer of nickel disposed on the aluminum sublayer, and a 200 nm thick sublayer of gold disposed on the nickel sublayer. First electrode 17 is therefore approximately 340 nm thick. The dopant concentration in the GaN sublayers of LRL 4 is adequately high that good ohmic contact is formed between metal 17 and LRL 4.

After the first and second electrodes have been added as shown in FIG. 18, the wafer bonded structure is singulated into separate blue LED devices. Singulation is performed by sawing the wafer bonded structure down the streets illustrated in FIG. 15 so that each mesa structure becomes a separate blue LED device. In the illustrated example, one of the resulting blue LED devices is then incorporated into the white LED assembly of FIGS. 1-3. The second electrode 16 is glued down to the metal core PCB 19 as illustrated in FIG. 3 using a layer of silver epoxy 18. The first metal electrode 17 is wirebonded via bond wire 64 to the second metal structure 59 of metal core PCB 19 as illustrated. After wirebonding, the retaining ring 20 of silicone is formed on the structure by silk screening. Alternatively, the retaining ring 20 is cut and shaped to the right dimensions, and then applied. Ring 20 is 0.5 to 3.0 mm high, and 0.2 mm to 1.5 mm wide. After the silicone has cured, the amount of phosphor 21 is dropped onto the blue LED device 54 so that it is retained by ring 20. The phosphor 21 is allowed to cure to form the completed white LED assembly 50.

FIG. 19 is a table that sets forth details about each step of the method of manufacture. The numbers in the left column of the table are the reference numerals for the various layers of the white LED assembly 50.

Figure 20:
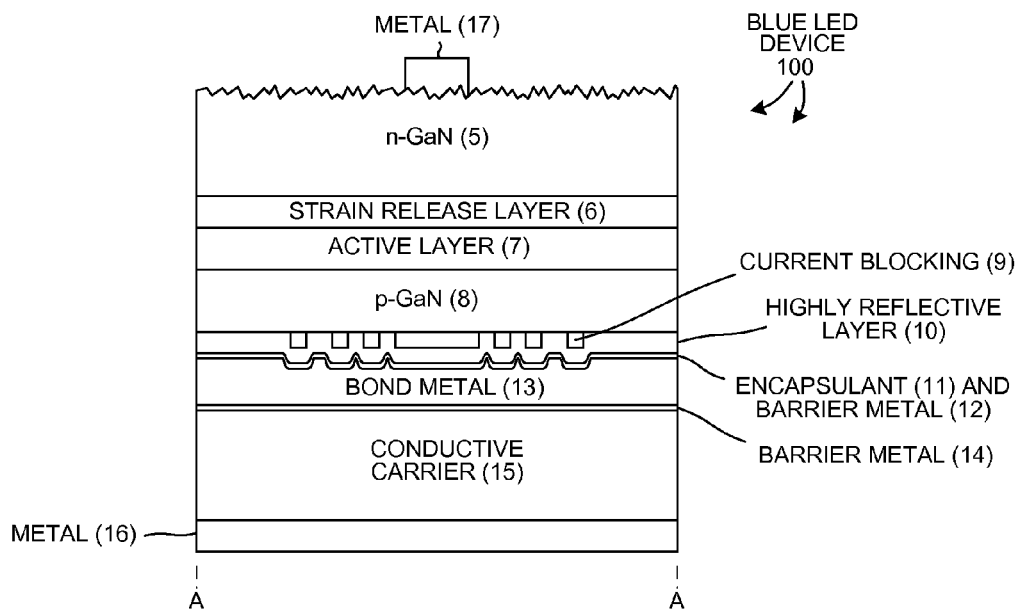
FIG. 20 is a cross-sectional diagram of a blue LED device that is formed by the method of manufacture set forth above in connection with FIGS. 6-18, except that all LRL is removed in the removal step illustrated in FIG. 14.

FIG. 20 is a cross-sectional diagram of a blue LED device 100 that is formed by the method of manufacture set forth above in connection with FIGS. 6-18, except that all of LRL 4 is removed in the removal step illustrated in FIG. 13. All or substantially all of the n-type layer 5 remains in the finished blue LED device 100. FIG. 17 is not to scale, but rather is a conceptual diagram.

Figure 21:
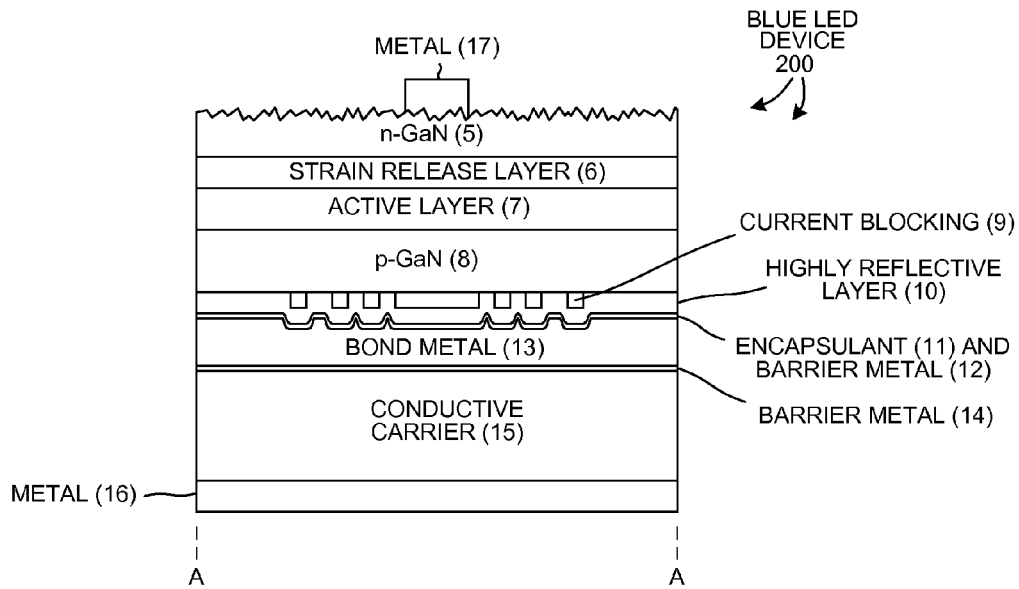
FIG. 21 is a cross-sectional diagram of a blue LED device that is formed by the method of manufacture set forth above in connection with FIGS. 6-18, except that all LRL is removed and some of the n-type layer is removed in the removal step illustrated in FIG. 14.

FIG. 21 is a cross-sectional diagram of a blue LED device 200 that is formed by the method of manufacture set forth above in connection with FIGS. 6-18, except that all of LRL 4 is removed and some of the n-type layer 5 is removed in the removal step illustrated in FIG. 13. All of the thin intervening sublayers of the n-type layer are removed, leaving only the last 900 nm thick GaN sublayer. This last GaN sublayer remains in the finished blue LED device 200. FIG. 18 is not to scale, but rather is a conceptual diagram.

Figure 22:
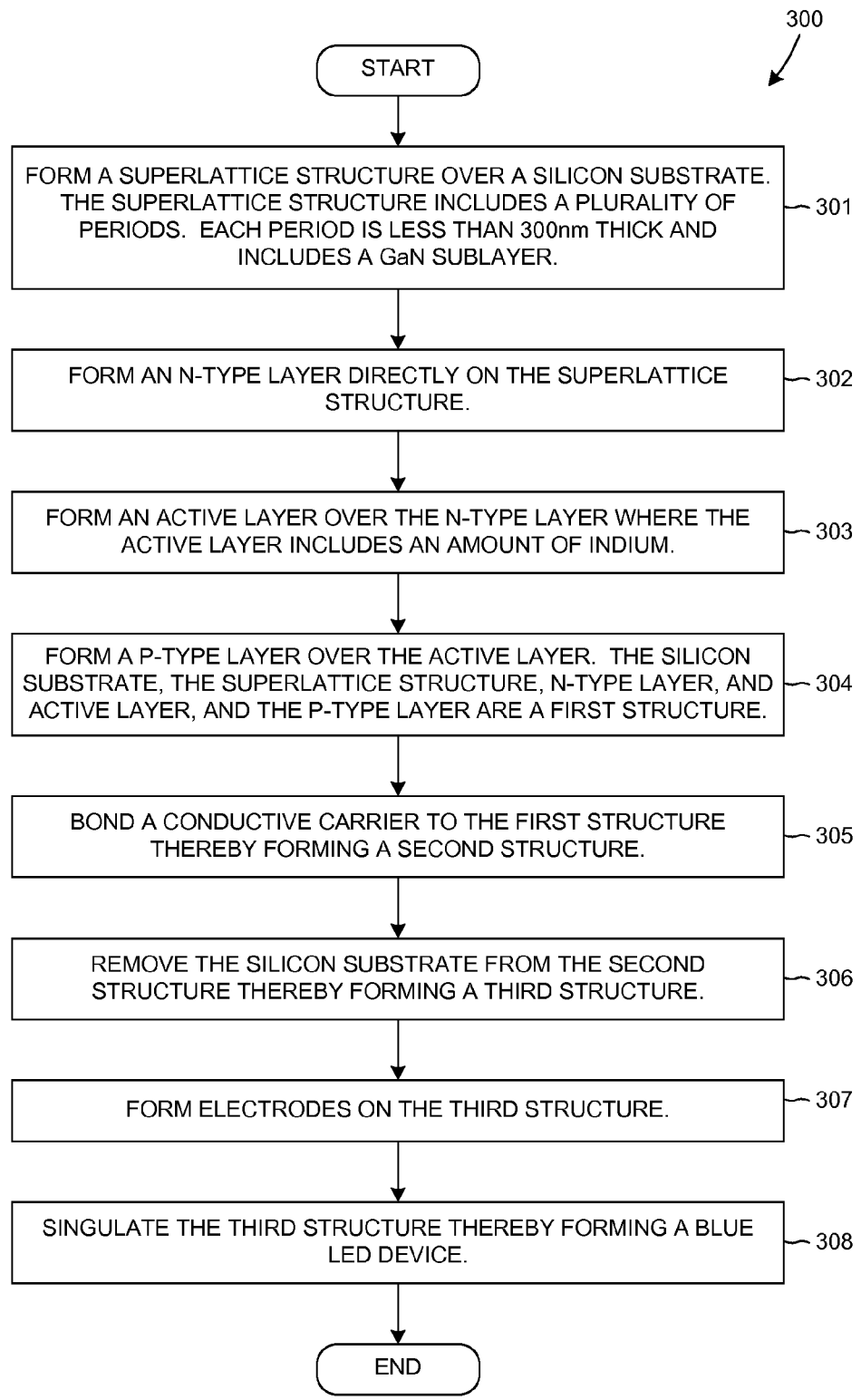
FIG. 22 is a flowchart of a method in accordance with a first novel aspect.

FIG. 22 is a flowchart of a method 300 in accordance with a first novel aspect. A superlattice structure is formed (step 301) over a silicon substrate. The superlattice structure includes a plurality of periods. Each period is less than 300 nm thick and includes a GaN sublayer. In one example, a buffer layer is formed on the silicon substrate, and a template layer is formed on the buffer layer, and the superlattice structure is formed on the template layer. Next, an n-type GaN layer is formed (step 302) directly on the superlattice structure. An active layer containing indium is formed (step 303) over the n-type layer. A p-type GaN layer is formed (step 304) over the active layer. The silicon substrate, the superlattice structure, the n-type layer, the active layer, and the p-type layer together are a first structure. A conductive carrier is bonded (step 305) to the first structure thereby forming a second structure. The silicon substrate is then removed (step 306) from the second structure thereby forming a third structure. Electrodes are formed (step 307) on the third structure. The third structure is then singulated (step 308) thereby forming a blue LED device.

Although certain specific embodiments are described above for instructional purposes, the teachings of this patent document have general applicability and are not limited to the specific embodiments described above. LRL 4 can be fabricated in numerous different suitable ways. In one example, LRL 4 involves periods, where each period includes a first aluminum-gallium-nitride layer and a second aluminum-gallium-nitride layer, where the aluminum concentrations in the two sublayers differ from one another. The composition of the two sublayers is given by $Al_xGa_{1-x}N/Al_yGa_{1-y}N$, where x and y are different nonzero numbers. Although a specific example is described above in which the aluminum-gallium-nitride and gallium-nitride sublayers of the LRL are of different thicknesses, in other examples the sublayers are of substantially the same thickness. In an AlGaN/GaN or AlGaN/AlGaN superlattice the aluminum concentration in one sublayer containing aluminum can be graded. The LRL can be an AlInN/GaN superlattice. The LRL can be an AlGaN/AlGaN/GaN superlattice where each period involves three sublayers.

Although the wafer bonding process involving a non-reactive barrier metal layer is described above in connection with an LED device that after wafer bonding is glued using silver epoxy to a metal core PCB to form the completed white LED assembly, the wafer bonding process is usable where an LED is provided with a gold/tin layer for die attachment. Due to the decreased concentration of tin in the gold/tin sublayer of metal bonding layer 13 during wafer bonding, the melting temperature of the metal bonding layer 13 is higher than 280° C. after the wafer bonding process has been performed. Accordingly, a completed LED device can be heated to a high enough temperature to melt an amount of gold/tin provided for die attachment purposes without melting the metal bonding layer 13 within the LED device itself. Although the wafer bonding process is described above in connection with an example in which the eutectic layer is a gold/tin layer, the wafer bonding process is not limited to require a gold/tin eutectic layer. In other examples the eutectic layer is a type of metal layer such as, for example, a gold/indium metal layer, and a palladium/indium metal layer. Although the wafer bonding process is described above in connection with an example where the silver encapsulation layer is platinum, other encapsulation layers such as nickel and rhodium may be employed.

Figure 23:
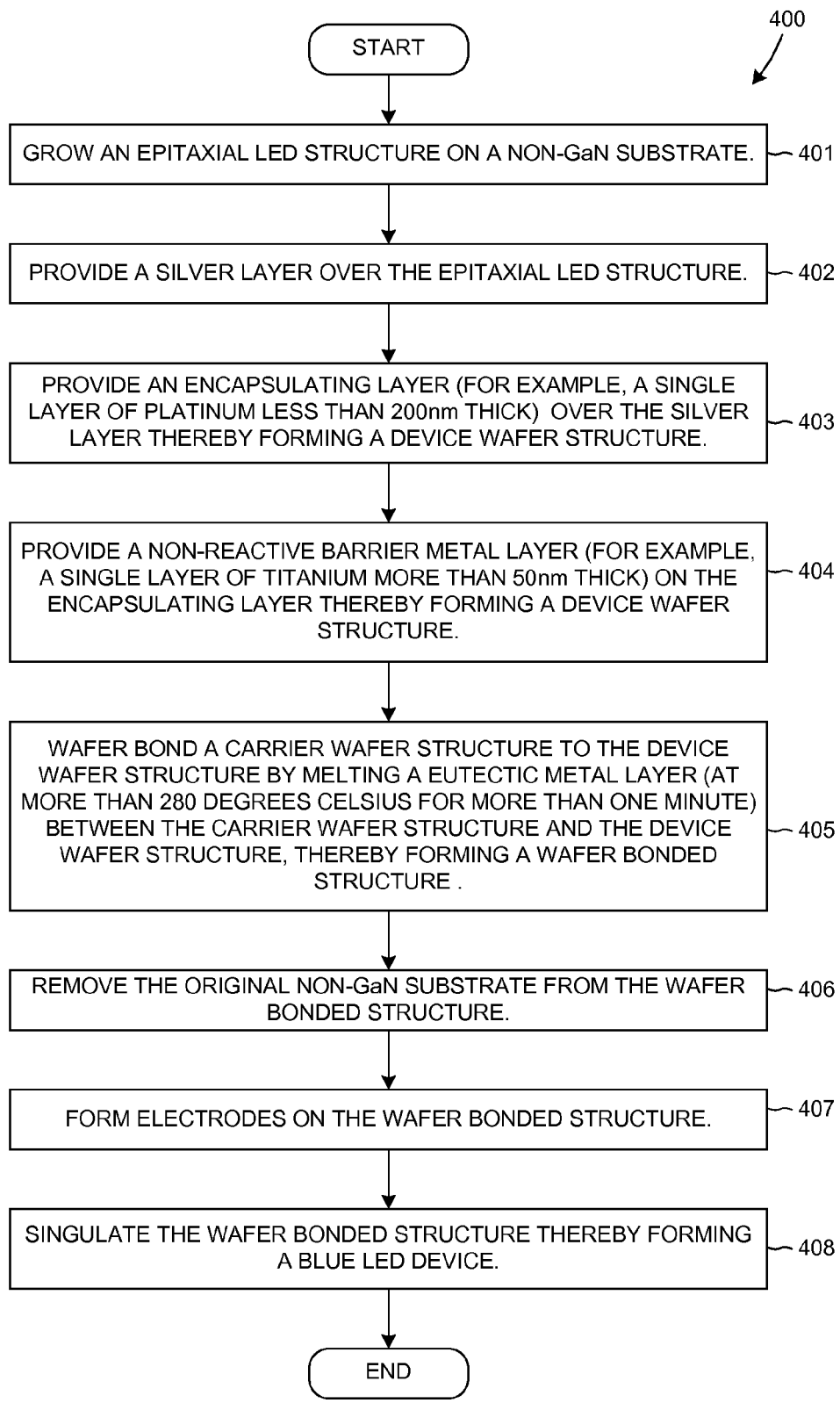
FIG. 23 is a flowchart of a method in accordance with a second novel aspect.

FIG. 23 is a flowchart of a method 400 in accordance with a second novel aspect. An epitaxial LED structure is grown (step 401) on a non-GaN substrate. The non-GaN substrate in one example is a silicon substrate and appropriate intervening buffer and template layers are employed. A silver layer is then provided (step 402) over the epitaxial LED structure to function as a mirror and to function as an ohmic contact to the epitaxial LED structure. An encapsulating layer is provided (step 403) over the silver layer. In one example, the encapsulating layer is a single layer of platinum that is less than 200 nm thick. A layer of non-reactive barrier metal is provided (step 404) over the encapsulating layer, thereby forming a device wafer structure. In one example, this non-reactive barrier metal layer is a single layer of titanium that is more than 50 nm thick. This single layer of titanium layer includes substantially no tungsten.

A carrier wafer structure includes a conductive carrier. The conductive carrier may be conductive silicon wafer. The carrier wafer structure is then wafer bonded (step 405) to the device wafer structure by melting a eutectic metal layer between the two wafer structures, thereby forming a wafer bonded structure. In one example, the eutectic metal layer involves a gold/tin sublayer having a melting temperature of approximately 282° C. This eutectic metal layer is melted by raising the temperature of the carrier wafer structure to more than 280° C. (for example, to 310° C.) and maintaining this elevated temperature for more than one minute.

In one example, the temperature of the carrier wafer structure is indirectly determined by placing an amount of gold/tin of the same composition of the eutectic bond metal layer in a fully loaded furnace chamber, and slowly increasing the set point of the furnace chamber until the gold/tin is observed to melt. This set point is assumed to correspond to a carrier device wafer temperature of 282° C. The set point of the furnace chamber is then increased an additional amount that is known to correspond to an increased furnace chamber temperature of 30° C. The wafer bonding process is carried out by using this increased furnace chamber setting for at least one minute without actually directly measuring the temperature of the wafer bonded structure within the furnace chamber.

After wafer bonding, the non-GaN substrate of the resulting wafer bonded structure is then removed (step 406). Electrodes are formed on the wafer bonded structure (step 407), and the wafer bonded structure is singulated thereby forming a plurality of blue LED devices (step 408). In one example of the method 400, the total thickness of any and all platinum layers in the completed blue LED devices is less than 200 nm, and the high temperature bond metal melting cycle (when the temperature of the carrier wafer structure is greater than 280° C.) is more than one minute.

Figure 24:
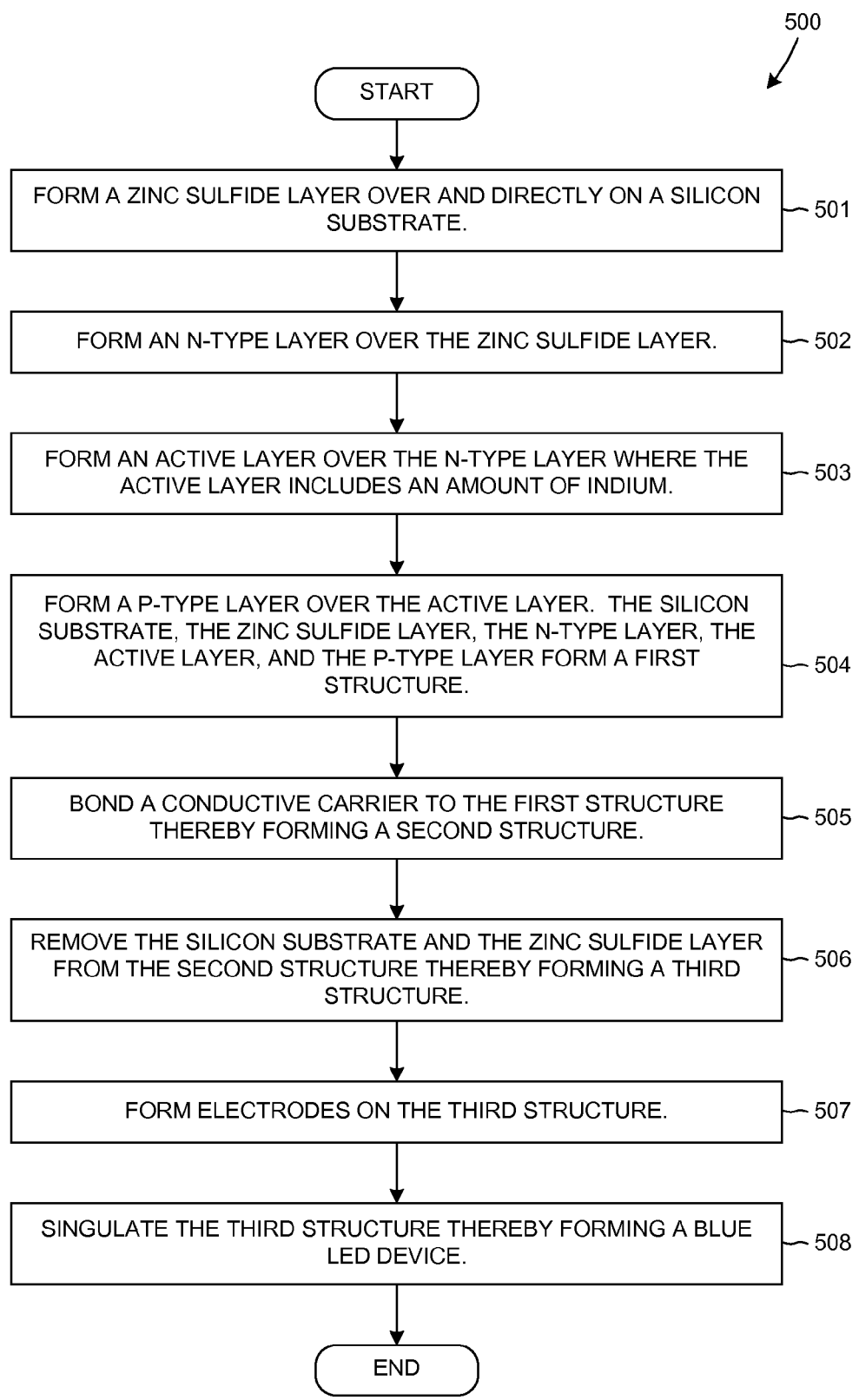
FIG. 24 is a flowchart of a method in accordance with a third novel aspect.

FIG. 24 is a flowchart of a method of manufacturing an LED device on silicon substrate using zinc-sulfide (ZnS) as a buffer layer in accordance with a third novel aspect. A zinc-sulfide (ZnS) layer is formed (step 501) over and directly on a silicon substrate. In one embodiment, the ZnS layer is a buffer layer formed on the silicon substrate, and a template layer is then formed on the buffer layer. Optionally, an aluminum-nitride (AlN) layer is formed over the zinc-sulfide layer, and an aluminum-gallium-nitride (AlGaN) layer is formed over the aluminum-nitride layer. The ZnS layer, the AlN layer, and the AlGaN layer form the buffer layer. Next, an n-type GaN layer is formed (step 502) over the template layer. An active layer containing indium is formed (step 503) over the n-type layer. A p-type GaN layer is formed (step 504) over the active layer. The n-type layer, the active layer, and the p-type layer together are an epitaxial LED structure. The silicon substrate, the ZnS layer, and the epitaxial LED structure together are a first structure. In one example, the first structure is device wafer structure 69 of FIG. 11. A conductive carrier is then bonded (step 505) to the first structure, thereby forming a second structure. In one example, the carrier is part of a carrier wafer structure such as carrier wafer structure 68 of FIG. 11. The original silicon substrate and the ZnS layer are then removed (step 506) from the second structure, thereby forming a third structure. Electrodes are formed (step 507) on the third structure. The third structure is then singulated (step 508), thereby forming a blue LED device.

Figure 25:
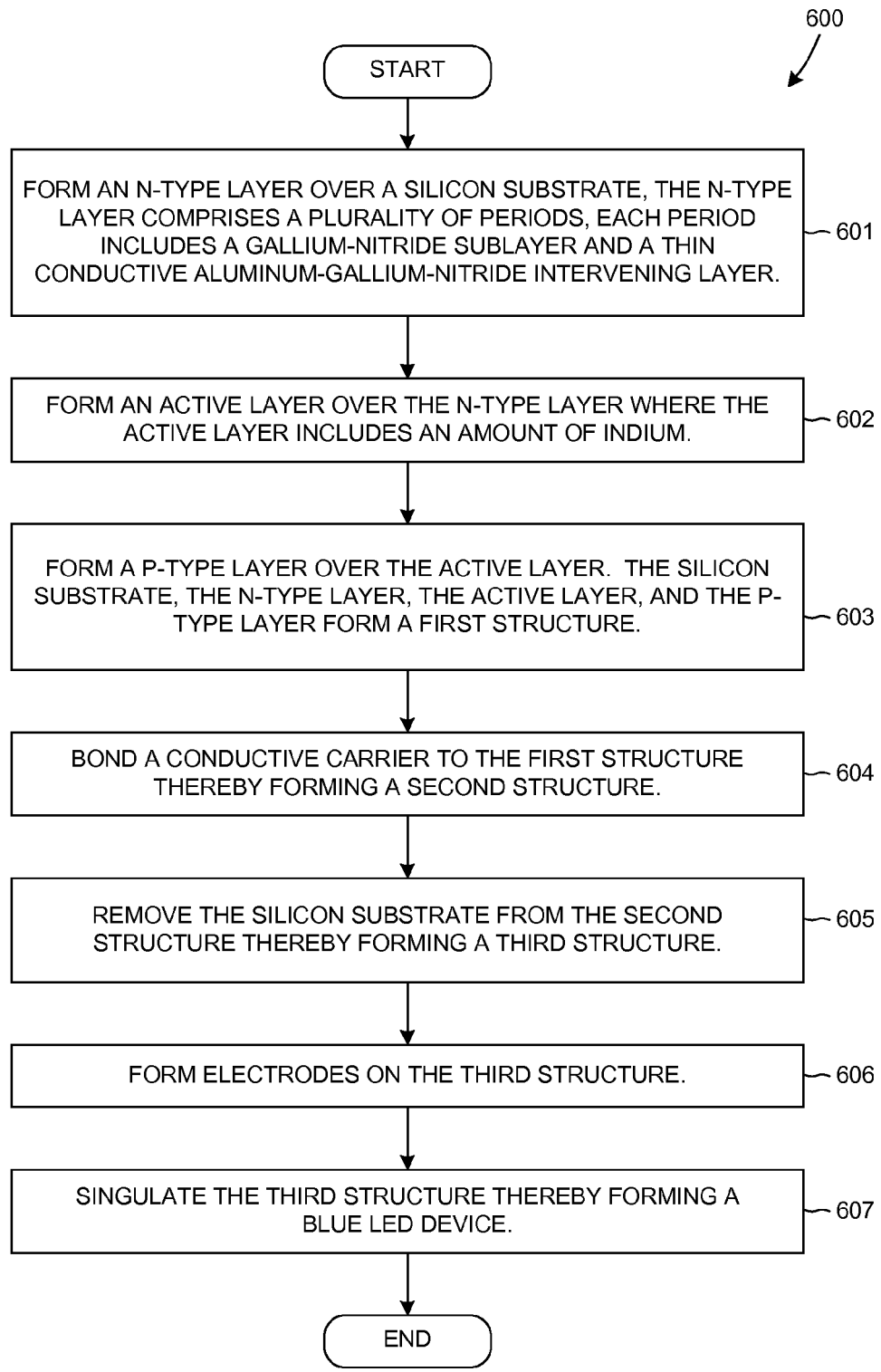
FIG. 25 is a flowchart of a method in accordance with a fourth novel aspect.

FIG. 25 is a flowchart of a method of manufacturing a blue LED device on silicon substrate in accordance with a fourth novel aspect. The blue LED device has an n-type gallium-nitride layer with multiple conductive intervening sublayers. An n-type layer is formed (step 601) over a silicon substrate. The n-type layer comprises a plurality of periods; each period of the n-type layer includes a gallium-nitride (GaN) sublayer and an aluminum-gallium-nitride doped with silicon (AlGaN:Si) intervening sublayer. The AlGaN:Si intervening sublayers are doped with Si and are electronically conductive.

Next, an active layer containing indium is formed (step 602) over the n-type layer. A p-type GaN layer is formed (step 603) over the active layer. The silicon substrate, the n-type layer, the active layer, and the p-type layer together form a first structure. A conductive carrier is bonded (step 604) to the first structure, thereby forming a second structure. The silicon substrate is then removed (step 605) from the second structure, thereby forming a third structure. Electrodes are formed (step 606) on the third structure. The third structure is then singulated (step 607) to form a blue LED device.

Buffer Layer of ZnTe or $TiO_2$

Figure 26:
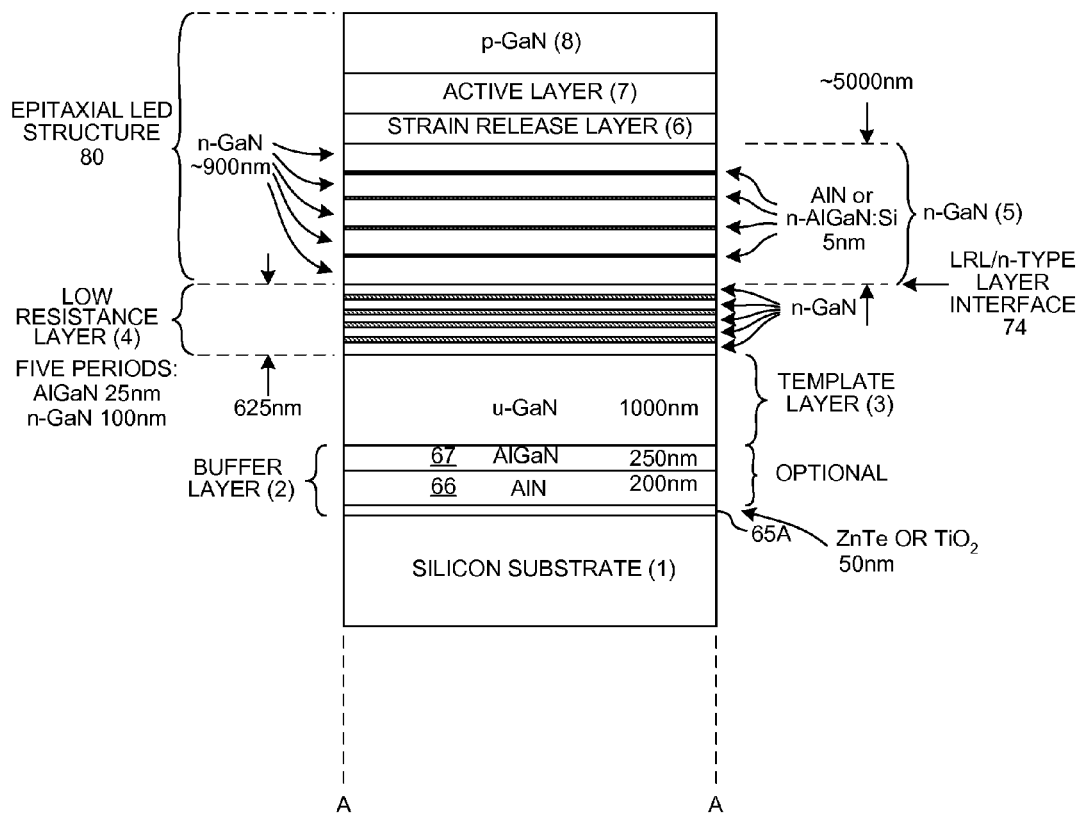
FIG. 26 is a cross-sectional diagram of the epitaxial PAN structure layers of the blue LED device of FIG. 3 in an embodiment in which the epitaxial LED structure was grown over a buffer layer including a layer of zinc telluride (ZnTe) or a titanium dioxide ($TiO_2$).

FIG. 26 is a cross-sectional diagram of the epitaxial PAN structure layers of another example of the blue LED device of FIG. 3. The structure of the example of FIG. 26 is identical to the structure illustrated in FIG. 6 except that the layer 65 of the example of FIG. 6 is a layer 65A of zinc telluride (ZnTe) or titanium dioxide ($TiO_2$) in the example of FIG. 26. Layer 65A is less than 100 nm thick.

In the case of layer 65A being a ZnTe layer, the layer 65A is a substantially homogenous layer of ZnTe disposed directly on the upper surface 65B of silicon substrate 1. In the case of layer 65A being a $TiO_2$ layer, the layer 65A is a substantially homogenous layer of $TiO_2$ disposed directly on the upper surface 65B of silicon substrate 1. The epitaxial LED structure 80 of the example of FIG. 6 is an epitaxial LED structure for a blue LED and has an active layer comprising gallium and nitrogen. Epitaxial LED structure 80 is formed over the layer 65A so that layer 65A is disposed between the epitaxial LED structure 80 and the silicon substrate 1.

As indicated in FIG. 26, the layers 66 and 67 are optional and may or may not be provided as part of the overall buffer layer 2 in a particular embodiment. Accordingly, in one example, the layer 65A is the buffer layer 2 and the buffer layer 2 includes no additional layers or sublayers. Layer 65A is simply referred to as "the buffer layer". In cases where AlN layer 66 is provided as part of the buffer layer 2, the ZnTe or $TiO_2$ layer 65A provides a diffusion barrier to help prevent small amounts of diffusion of aluminum from the AlN layer into the silicon of the substrate. Small amounts of such diffusion may compromise the AlN layer in minor ways and may result in the n-GaN of the template layer 3 having a lower crystal quality than it would otherwise have.

In one case, silicon substrate 1 is a monocrystalline silicon wafer having the (111) or (100) crystal orientation relative to its top surface. In another case, silicon substrate 1 is a monocrystalline silicon wafer (211) of the type used in the manufacture of MCT (mercury cadmium telluride) infrared photon detectors as described in U.S. Patent Application Publication US2010/0140735 (the entire subject matter of which is incorporated herein by reference). In examples where layer 65A is ZnTe, the ZnTe film may be Wurzite ZnTe deposited on the silicon wafer by MOCVD at a substrate temperature of 400° C. to 600° C., using dimethylzinc (DMZn) and diisopropyltelluride (DIPTe) as source materials. Each aZnTe lattice spacing of 6.10 Å corresponds to two aSi(111) lattice spacings of 3.84 Å. The aZnTe lattice spacing of 6.10 Å divided by two is 3.05 Å, which is smaller than the GaN lattice constant of 3.189 Å. The ZnTe buffer layer therefore provides compressive strain to the GaN on it and relieves tensile strain in the overlying GaN. The 3.05Å spacing is smaller than the lattice constant of AlN, so the ZnTe buffer provides even more compressive strain to the GaN layers than would a conventional AlN buffer.

In examples where layer 65A is $TiO_2$, the $TiO_2$ film may be deposited on the silicon wafer by MOCVD at a substrate temperature of 400° C. to 600° C. using titanium tetraisopropoxide $Ti(OC_3H_7)_4$ (TTIP) as a precursor and nitrogen as a carrier gas. Each TiO2 lattice spacing of 3.05 Å corresponds to one aSi(111) lattice spacing of 3.84 Å. The $TiO_2$ lattice spacing of 3.05 Å is smaller than the GaN lattice constant of 3.189 Å. The $TiO_2$ buffer layer therefore provides compressive strain to the GaN on it to relieve tensile strain in the GaN. The 3.05 Å spacing is smaller than the lattice constant of AlN, so the $TiO_2$ buffer provides even more compressive strain to the GaN layers than would a conventional AlN buffer.

The forming of layer 65A is not limited to these deposition methods, but rather other deposition methods known in the art for the forming of zinc telluride and titanium dioxide layers can be employed. Layer 65A need not be pure ZnTe or pure $TiO_2$, but rather the chemical composition of layer 65A may involve other constituents and other compounds of zinc and tellurium or titanium and oxygen. A ZnTe layer may, for example, be doped with antimony (Sb).

Once the structure of FIG. 26 has been fabricated, subsequent processing as described above in connection with FIGS. 7-18 is carried out to realize the white LED assembly 50 as illustrated in FIGS. 1-3.

Figure 27:
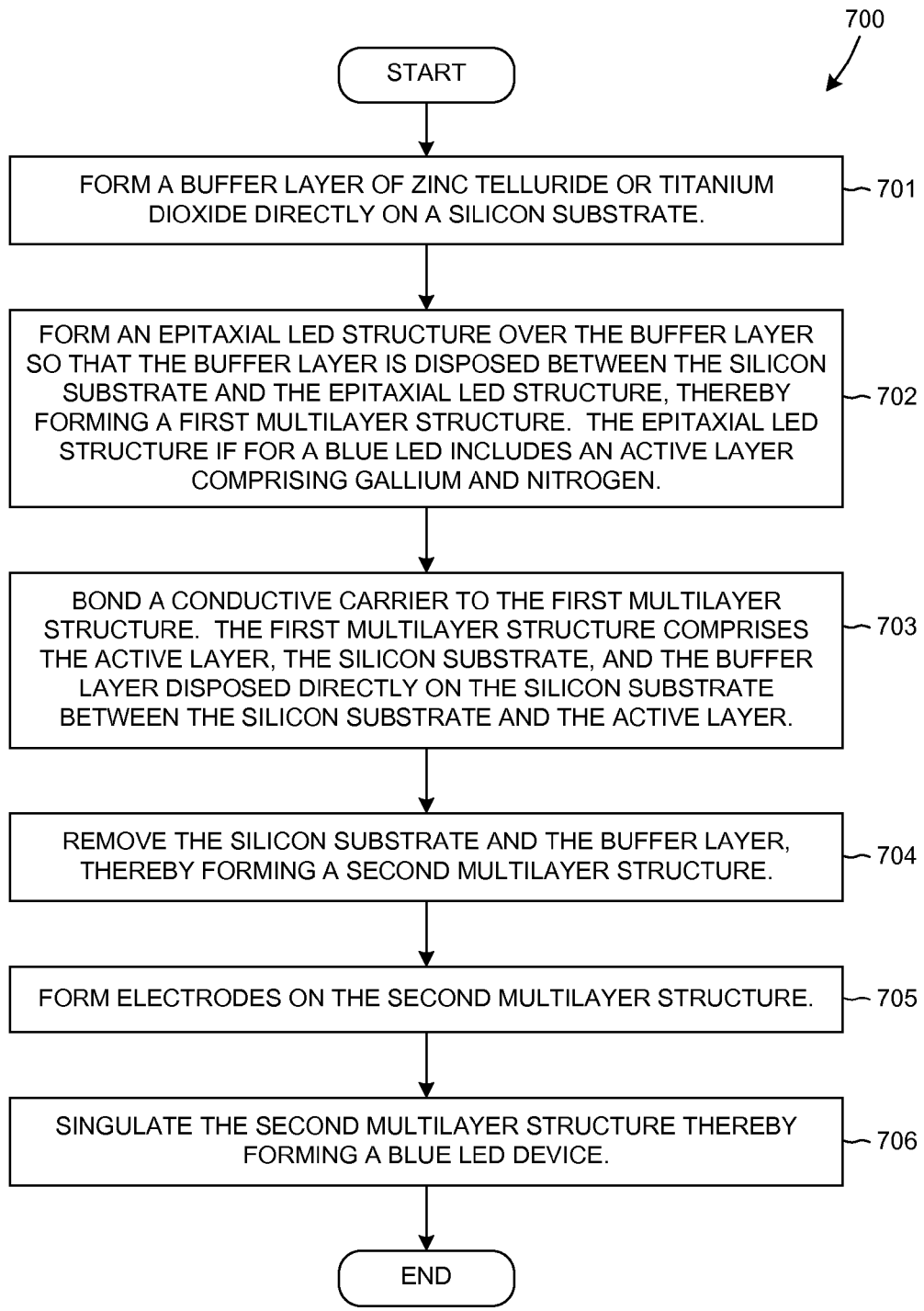
FIG. 27 is a diagram of a method in which the epitaxial layers of a blue LED are grown on a silicon substrate using a ZnTe or $TiO_2$ buffer layer.

FIG. 27 is a flowchart of a method 700 in which epitaxial layers of a blue LED are grown on a silicon substrate using ZnTe or $TiO_2$ buffer layer. In a first step (step 701), a buffer layer of zinc telluride (ZnTe) or titanium dioxide ($TiO_2$) is formed directly on a silicon substrate. Optionally, a layer of AlN or a layer of another suitable buffer layer material is formed on the ZnTe or $TiO_2$ layer as a second layer of the buffer layer. Optionally, a GaN template layer (for example, u-GaN) is then formed over the buffer layer. Next, an epitaxial LED structure for a blue GaN-based LED is formed (step 702) over the buffer layer so that the buffer layer is disposed between the silicon substrate and the epitaxial LED structure, thereby forming a first multilayer structure. A conductive carrier is then bonded (step 703) to the first multilayer structure. The first multilayer structure comprises an active layer (part of the epitaxial LED structure), the silicon substrate, and the buffer layer. The epitaxial LED structure is for a blue LED and the active layer comprises gallium and nitrogen. In a next step (step 704), the silicon substrate is removed from the first multilayer structure, thereby forming a second multilayer structure. Electrodes are formed (step 705) on the second multilayer structure. The second multilayer structure is then singulated (step 706) to form a blue LED device.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. An apparatus, comprising:
    a silicon substrate;
    a buffer layer disposed directly on the silicon substrate and comprising an aluminum nitride (AlN) layer and a zinc telluride (ZnTe) layer formed between the silicon substrate and the AlN layer;
    a gallium nitride (GaN) template layer disposed on the buffer layer; and
    an epitaxial light emitting diode (LED) structure disposed on the GaN template layer, wherein the buffer layer is disposed between the silicon substrate and the epitaxial LED structure, wherein the epitaxial LED structure comprises an active layer disposed between a p-type layer and an n-type layer, and wherein the active layer comprises gallium and nitrogen.

2. The apparatus of claim 1, wherein the ZnTe layer is a single substantially homogenous layer of zinc telluride (ZnTe).

3. The apparatus of claim 1, wherein the buffer layer is less than one hundred nanometers thick.

4. The apparatus of claim 1, wherein the n-type layer of the epitaxial LED structure has a thickness of at least two thousand nanometers.

5. The apparatus of claim 1, wherein the ZnTe layer is directly disposed on the silicon substrate.

6. The apparatus of claim 1, wherein the buffer layer further comprises an aluminum gallium nitride layer disposed between the AlN layer and the GaN template layer.

7. The apparatus of claim 1, wherein the GaN template layer is an undoped GaN layer.

8. An apparatus, comprising:
a silicon substrate;
a buffer layer disposed directly on the silicon substrate and comprising an aluminum nitride (AlN) layer and a titanium dioxide ($TiO_2$) layer formed between the silicon substrate and the AlN layer;
a gallium nitride (GaN) template layer disposed on the buffer layer; and
an epitaxial light emitting diode (LED) structure disposed on the GaN template layer, wherein the buffer layer is disposed between the silicon substrate and the epitaxial LED structure, wherein the epitaxial LED structure comprises an active layer disposed between a p-type layer and an n-type layer, and wherein the active layer comprises gallium and nitrogen.

9. The apparatus of claim 8, wherein the $TiO_2$ layer is a single substantially homogenous layer of titanium dioxide ($TiO_2$).

10. The apparatus of claim 8, wherein the buffer layer is less than one hundred nanometers thick.

11. The apparatus of claim 8, wherein the $TiO_2$ layer is directly disposed on the silicon substrate.

12. The apparatus of claim 8, wherein the buffer layer further comprises an aluminum gallium nitride layer disposed between the AlN layer and the GaN template layer.

13. The apparatus of claim 8, wherein the GaN template layer is an undoped GaN layer.

* * * * *